(12) United States Patent
Uemura et al.

(10) Patent No.: US 9,831,199 B2
(45) Date of Patent: Nov. 28, 2017

(54) ELECTRONIC DEVICE, ELECTRONIC PART, AND SOLDER

(71) Applicant: FUJITSU LIMITED, Kawasaki-shi, Kanagawa (JP)

(72) Inventors: Taiki Uemura, Kawasaki (JP); Seiki Sakuyama, Yamoto (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/275,522

(22) Filed: Sep. 26, 2016

(65) Prior Publication Data

US 2017/0125366 A1    May 4, 2017

(30) Foreign Application Priority Data

Nov. 2, 2015  (JP) .................. 2015-215475

(51) Int. Cl.
*H01L 23/52* (2006.01)
*H01L 23/00* (2006.01)

(52) U.S. Cl.
CPC .............. *H01L 24/05* (2013.01); *H01L 24/13* (2013.01); *H01L 24/16* (2013.01); *H01L 24/48* (2013.01); *H01L 24/73* (2013.01); *H01L 2224/0401* (2013.01); *H01L 2224/05609* (2013.01); *H01L 2224/05611* (2013.01); *H01L 2224/05613* (2013.01); *H01L 2224/05639* (2013.01); *H01L 2924/20102* (2013.01); *H01L 2924/20103* (2013.01)

(58) Field of Classification Search
CPC ......... H01L 24/05; H01L 24/13; H01L 24/16; H01L 24/48; H01L 24/73; H01L 2224/05609; H01L 2224/05611; H01L 2224/05613; H01L 2224/05639
USPC .......................................... 257/773
See application file for complete search history.

(56) References Cited

U.S. PATENT DOCUMENTS 8,227,536 B2 * 7/2012 Watanabe ............ B22F 1/0059
                                                                148/24
8,922,011 B2 * 12/2014 Osumi ............... H01L 23/49811
                                                                257/693

FOREIGN PATENT DOCUMENTS

JP        09-295184      11/1997
JP        2001-024021    1/2001

\* cited by examiner

*Primary Examiner* — Luan C Thai
(74) *Attorney, Agent, or Firm* — Fujitsu Patent Center

(57) ABSTRACT

An electronic device includes a first electronic part, a second electronic part opposite the first electronic part, and a bonding portion between the first electronic part and the second electronic part. The bonding portion contains a solder containing a substance whose crystal structure reversibly changes in temperature rise and fall processes which accompany the operation of the electronic device or electronic equipment including the electronic device. A change in the crystal structure of the substance contained in the solder promotes recovery and recrystallization of the solder in the temperature rise and fall processes which accompany the operation of the electronic device or the electronic equipment. As a result, the coarsening of crystal grains in the solder is suppressed.

9 Claims, 18 Drawing Sheets

ELECTRONIC DEVICE, ELECTRONIC PART, AND SOLDER

CROSS-REFERENCE TO RELATED APPLICATION

This application is based upon and claims the benefit of priority of the prior Japanese Patent Application No. 2015-215475, filed on Nov. 2, 2015, the entire contents of which are incorporated herein by reference.

FIELD

The embodiments discussed herein are related to an electronic device, an electronic part, and a solder.

BACKGROUND

The technique of bonding electronic parts together by the use of a solder is known. For example, the use of the technique of mixing a filler with a solder or the technique of forming an alloy having martensitic transformation properties under or around a solder is proposed regarding bonding electronic parts together by the use of a solder in order to, for example, relax stress in a bonding portion or suppress the appearance of a crack.

Japanese Laid-open Patent Publication No. 09-295184
Japanese Laid-open Patent Publication No. 2001-24021

With an electronic device including a group of electronic parts bonded together by the use of a solder or an electronic apparatus (electronic equipment) including the electronic device, crystal grains in a solder contained in a bonding portion may coarsen due to heat generated in temperature rise and fall processes which accompany the operation. If the crystal grains in the solder contained in the bonding portion coarsen, a crack tends to propagate. This may lead to deterioration in the reliability.

SUMMARY

According to an aspect, there is provided an electronic device including a first electronic part, a second electronic part opposite the first electronic part, and a bonding portion which bonds the first electronic part and the second electronic part together, the bonding portion containing a solder containing a substance whose crystal structure reversibly changes in temperature rise and fall processes which accompany operation.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First a first Embodiment will be described.

Figure 1:
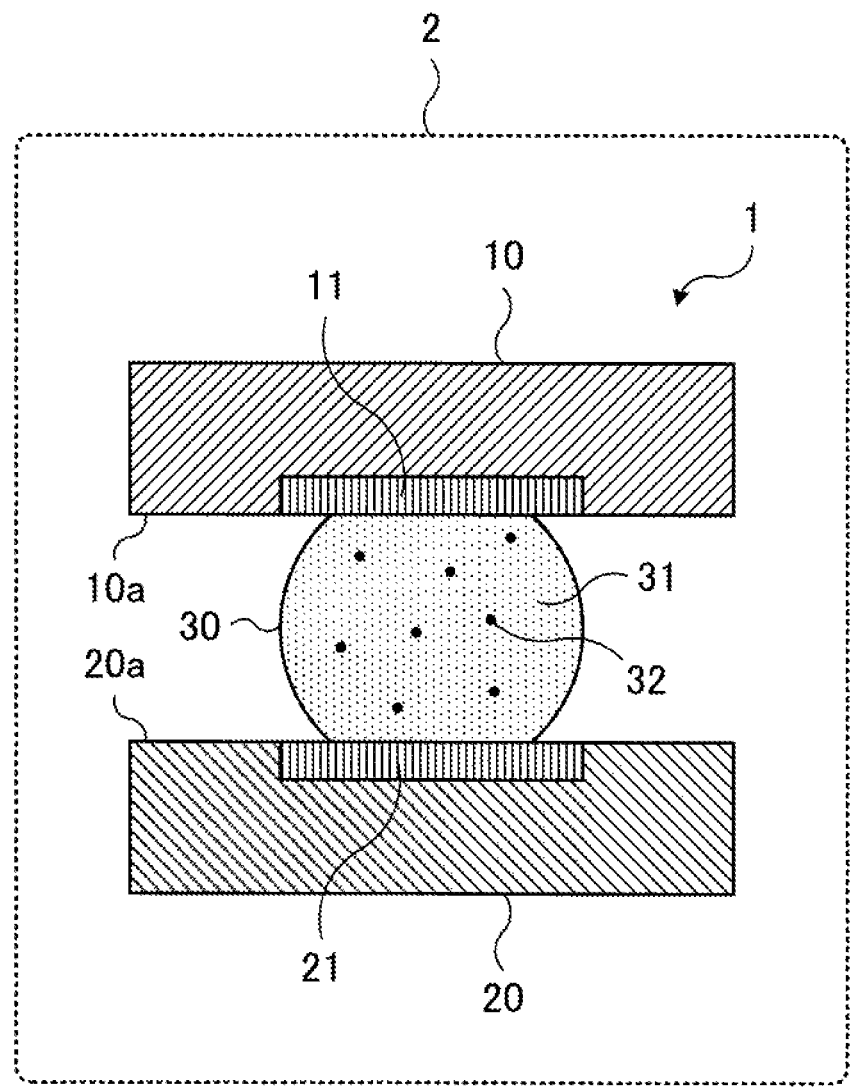
FIG. 1 illustrates an example of an electronic device according to a first embodiment.

FIG. 1 illustrates an example of an electronic device according to a first embodiment. FIG. 1 schematically illustrates a section of important part of an example of an electronic device according to a first embodiment.

An electronic device 1 illustrated in FIG. 1 includes an electronic part 10, an electronic part 20, and a bonding portion 30.

The electronic part 10 is a semiconductor element (semiconductor chip), a semiconductor device (semiconductor package) including a semiconductor chip, a circuit board, or the like. The electronic part 10 has an electrode 11 in a surface 10a which is electrically connected to a transistor or a conductor portion, such as a wiring or a via, which is not illustrated and which is internally formed.

The electronic part 20 is a semiconductor chip, a semiconductor package, a circuit board, or the like. The electronic part 20 is placed opposite the surface 10a of the electronic part 10. The electronic part 20 has an electrode 21 in a position corresponding to the electrode 11 of the electronic part 10 in a surface 20a opposite the surface 10a of the electronic part 10. The electrode 21 is electrically connected to a transistor or a conductor portion, such as a wiring or a via, which is not illustrated and which is internally formed.

The electrode 11 of the electronic part 10 or the electrode 21 of the electronic part 20 is made of, for example, copper (Cu), a material containing Cu, nickel (Ni), a material containing Ni, gold (Au), or a material containing Au. An electrode layer having a single-layer structure or a laminated structure and made of Cu, Ni, Au, or the like is used as the electrode 11 or the electrode 21. Furthermore, a laminated structure in which a barrier metal layer made of Ni, tantalum (Ta), titanium (Ti), tungsten (W), aluminum (Al), or the like is formed over such an electrode layer may be used.

For example, the electrode 11 of the above electronic part 10 and the electrode 21 of the above electronic part 20 are bonded together by the bonding portion 30. The electronic part 10 and the electronic part are electrically connected via the electrode 11, the bonding portion 30, and the electrode 21.

In this example, a pair of the electrode 11 and the electrode 21 and the bonding portion 30 which bonds them together are illustrated. However, there is no limit on the number of electrodes 11, electrodes 12, or bonding portions 30. Plural electrodes 11 and plural electrodes 21 may be formed in pairs in the electronic part 10 and the electronic part 20 respectively. Furthermore, plural bonding portions 30 which bond the plural electrodes 11 and the plural electrodes 21 together may be formed.

A combination of the electronic part 10 and the electronic part 20 bonded together by the bonding portion may be a combination of a semiconductor chip and a circuit board, a combination of a semiconductor package and a circuit board, a combination of a semiconductor chip and a semiconductor package, or the like. Furthermore, a combination of the electronic part 10 and the electronic part 20 bonded together by the bonding portion 30 may be a combination of semiconductor chips, a combination of semiconductor packages, a combination of circuit boards, or the like. In addition, a combination of the electronic part 10 and the electronic part 20 bonded together by the bonding portion 30 may be a combination of electronic parts after dicing, a combination of an electronic part before dicing and an electronic part after dicing, or a combination of electronic parts before dicing.

The bonding portion 30 which bonds the electronic part 10 and the electronic part 20 together contains a solder 31. For example, a solder containing tin (Sn) or a solder (Pb-free solder) containing Sn and not containing lead (Pb) is used as the solder 31 in the bonding portion 30. In addition, the solder 31 in the bonding portion 30 contains a substance 32 whose crystal structure reversibly changes (reversibly transforms) in temperature rise and fall processes which accompany the operation of the electronic device 1 or an electronic apparatus (electronic equipment) including the electronic device 1. For convenience, FIG. 1 schematically illustrates the electronic apparatus including the electronic device 1 as electronic equipment 2 by a dotted line.

Heat may be generated at the time of the operation of the electronic device 1. Furthermore, heat may be generated by the electronic device 1 in the electronic equipment 2, another electronic device in the electronic equipment 2, or the like at the time of the operation of the electronic equipment 2 including the electronic device 1. When heat is generated with the operation of the electronic device 1 or the electronic equipment 2 and is conducted to the bonding portion 30 of the electronic device 1, the temperature of the bonding portion 30 rises. After the operation of the electronic device 1 or the electronic equipment 2 ends, the temperature of the bonding portion 30 falls. Usually the upper limit of the temperature of the bonding portion 30 is below the melting point of the solder 31 in the bonding portion 30.

The solder 31 in the bonding portion 30 contains the substance 32 whose crystal structure reversibly changes in temperature rise and fall processes which accompany the operation of the electronic device 1 or the electronic equipment 2. A change in the temperature of the bonding portion 30 which accompanies the operation of the electronic device 1 or the electronic equipment 2 depends on the structure of the electronic device 1 or the electronic equipment 2. For example, the temperature of the bonding portion 30 is 0 to 30° C. before the operation of the electronic device 1 or the electronic equipment 2. The temperature of the bonding portion 30 is 80 to 100° C. at the time of the operation of the electronic device 1 or the electronic equipment 2.

A case where a solder not containing the above substance 32 is used for forming a bonding portion which bonds electronic parts together will now be described.

Usually a metal material recovers and recrystallizes and its structure goes into a stabler state, at a temperature higher than or equal to half of the melting point.

However, if a solder has a comparatively low melting point, that is to say, a solder is what is called a low melting point solder or if the temperature of a solder rises to a comparatively high temperature with the operation of an electronic device or the like in which the solder is used, crystal grains in the solder may coarsen (crystal grains grow) due to applied heat. Once the crystal grains in the solder have coarsened, the crystal grains may coarsen further due to a rise in the temperature which accompanies the same operation. If the crystal grains are not remelted, they do not return to fine crystal grains or it is extremely rare that they return to fine crystal grains. If a solder not containing the above substance 32 is used, crystal grains comparatively tend to coarsen due to heat applied continuously or repeatedly with the operation of an electronic device or the like.

When crystal grains in a solder coarsen, the number of crystals contained in a bonding portion formed by the use of the solder reduces. Unlike a case where a polycrystalline material is used, the bonding portion has anisotropy caused by crystal orientation. As a result, individual bonding portions differ in property such as strength or conductivity. For example, there may be variation in the characteristics of products, such as electronic devices, including plural bonding portions or it may be impossible to properly evaluate the characteristics of products, such as electronic devices, including plural bonding portions. In addition, a structure including fine crystal grains has the function of suppressing crack propagation by the fine structure. On the other hand, if the number of coarse crystal grains increases, a crack propagates comparatively easily. This may lead to deterioration in bonding reliability.

If the solder 31 containing the above substance 32 is used as the bonding portion 30 between the electronic part 10 and the electronic part 20, the following actions and effects are obtained.

Figure 2:
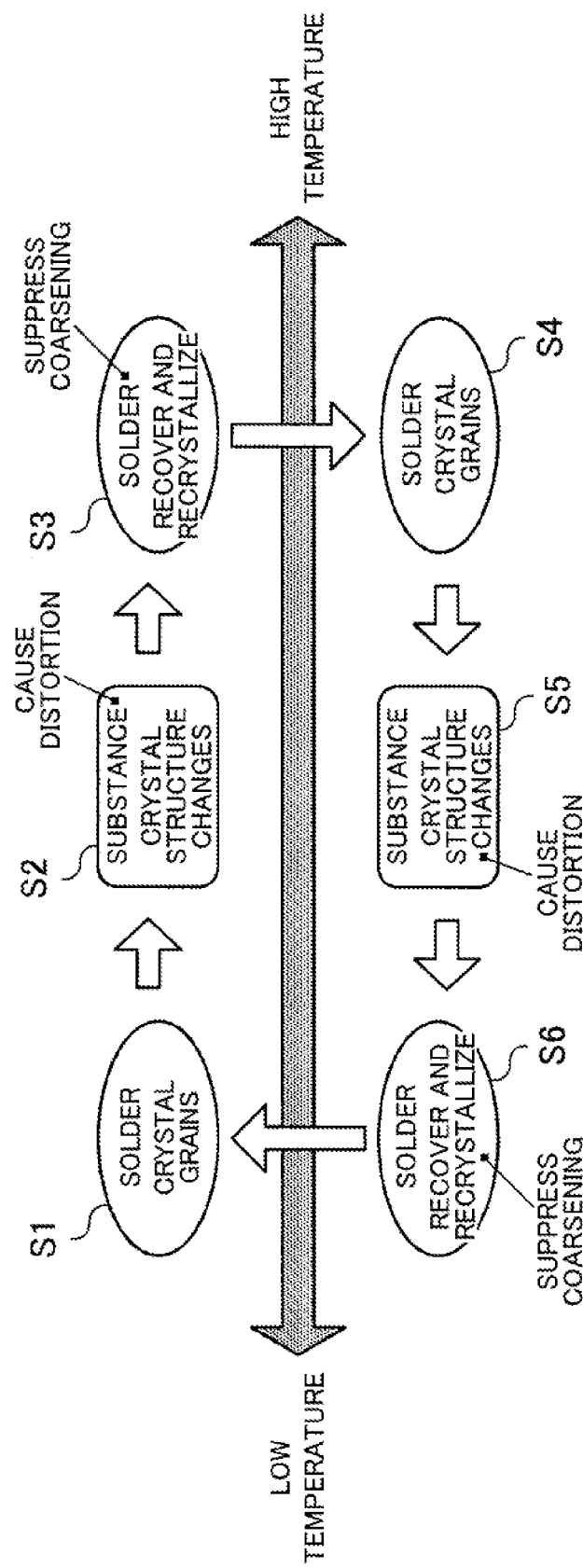
FIG. 2 schematically illustrates actions and effects obtained in a bonding portion in the electronic device according to the first embodiment.

FIG. 2 schematically illustrates actions and effects obtained in the bonding portion in the electronic device according to the first embodiment.

For example, the solder 31 containing the substance 32 whose crystal structure reversibly changes in temperature rise and fall processes which accompany the operation of the electronic device 1 or the electronic equipment 2 is used for forming the bonding portion 30 between the electronic part 10 and the electronic part 20 included in the electronic device 1 or the electronic equipment 2. Usually the solder 31 in the bonding portion has many crystal grains before the operation of the electronic device 1 or the electronic equipment 2 including the bonding portion 30 (step S1). The solder 31 in the bonding portion 30 has comparatively fine crystal grains before the operation of the electronic device 1 or the electronic equipment 2, depending on recrystallization at the time of bonding the electronic part 10 and the electronic part 20 together, the composition of the solder 31, or the like.

When the electronic device 1 or the electronic equipment 2 operates and the temperature of the bonding portion 30 rises with the operation, the crystal structure of the substance 32 contained in the solder 31 changes and the substance 32 transforms, in a temperature rise process of the bonding portion 30 (step S2). Such a change in the crystal structure of the substance 32 in the temperature rise process causes distortion in the solder 31.

The distortion in the solder 31 caused by the change in the crystal structure of the substance 32 promotes recovery and recrystallization of the solder 31 in the temperature rise process of the bonding portion 30 which accompanies the above operation (step S3). Even when the temperature of the bonding portion 30 rises, the distortion in the solder 31 caused by the change in the crystal structure of the substance 32 functions as driving force. This promotes recovery and recrystallization of the solder 31 and suppresses the coarsening of crystal grains in the solder 31. That is to say, many fine crystal grains (recrystallized grains) are formed. As a result, the formation of coarse crystal grains, the coarsening of crystal grains caused by the growth, or the like is suppressed. For example, comparatively fine crystal grains before the rise in the temperature of the bonding portion 30 are maintained or crystal grains whose size is close to that of comparatively fine crystal grains before the rise in the temperature of the bonding portion 30 are obtained.

As sated above, the distortion caused by the change in the crystal structure of the substance 32 in the temperature rise process (step S2) promotes recovery and recrystallization of the solder 31 (step S3). As a result, the solder 31 in which the coarsening of crystal grains is suppressed is obtained (step S4).

After the operation of the electronic device 1 or the electronic equipment 2 ends, the temperature of the bonding portion 30 falls to a determined temperature, such as room temperature, by natural cooling or forced cooling using a cooling system. The crystal structure of the substance 32 contained in the solder 31 in the bonding portion 30 also changes in this temperature fall process (step S5). Such a change in the crystal structure of the substance 32 in the temperature fall process causes distortion in the solder 31.

The distortion in the solder 31 caused in the temperature fall process of the bonding portion 30 promotes recovery and recrystallization of the solder 31 (step S6). When the temperature of the bonding portion 30 falls, the distortion in the solder 31 caused by the change in the crystal structure of the substance 32 also functions as driving force. This promotes recovery and recrystallization of the solder 31 and suppresses the coarsening of crystal grains in the solder 31. For example, comparatively fine crystal grains before the rise in the temperature of the bonding portion 30 caused by the operation are maintained or crystal grains whose size is close to that of comparatively fine crystal grains before the rise in the temperature of the bonding portion 30 are obtained.

As stated above, the distortion caused by the change in the crystal structure of the substance 32 in the temperature fall process (step S5) promotes recovery and recrystallization of the solder 31 (step S6). As a result, the solder 31 in which the coarsening of crystal grains is suppressed is obtained (step S1).

As has been described, the solder 31 used as the bonding portion 30 between the electronic part 10 and the electronic part 20 contains the substance 32. By doing so, the crystal structure of the substance 32 changes, that is to say, the substance 32 transforms. As a result, the coarsening of crystal grains in the solder 31 is suppressed in the temperature rise and fall processes which accompany the operation of the electronic device 1 or the electronic equipment 2. Even if the operation (rise in the temperature) is performed continuously or the operation (rise and fall in the temperature) is repeated more than one time, the change in the crystal structure of the substance 32 suppresses the coarsening of crystal grains in the solder 31.

By suppressing the coarsening of crystal grains in the solder 31, the bonding portion 30 has a structure in which it is difficult for a crack to propagate. As a result, the reliability of bonding between the electronic part 10 and the electronic part 20 is improved. Furthermore, if crystal grains coarsen, the solder 31 has anisotropy caused by crystal orientation. Suppressing the coarsening of crystal grains in the solder 31 suppresses the anisotropy. Accordingly, variation in the properties of different bonding portions 30 included in different electronic devices 1 or one electronic device 1 is suppressed.

The solder 31 contained in the bonding portion contains the substance 32. By doing so, the bonding portion 30 with high reliability is realized. This improves the reliability of the electronic device 1 or the electronic equipment 2 including the bonding portion 30.

In the above steps S5 and S6 illustrated in FIG. 2, the temperature of the electronic device 1 or the electronic equipment 2 after the operation is lowered to room temperature and the solder 31 is recovered and recrystallized. In this case, it is desirable that the room temperature be higher than or equal to half of the melting point of the solder 31 in absolute temperature. If the room temperature is, for example, 27° C., the relationship between the room temperature and the melting point Tm of the solder 31 containing the substance 32 is represented by $$(27[°\text{ C.}]+273)[K] \geq 0.5 \times (Tm[°\text{ C.}]+273)[K] \quad (1)$$

In order to recover and recrystallize the solder 31 at a room temperature of 27° C., it is desirable from inequality (1) that the melting point Tm of the solder 31 containing the substance 32 be lower than or equal to 327° C.

In order to recover and recrystallize the solder further at a room temperature of 27° C., the melting point Tm of the solder 31 is set by the use of $$(27[°\text{ C.}]+273)[K] \geq 0.6 \times (Tm[°\text{ C.}]+273)[K] \quad (2)$$

In order to recover and recrystallize the solder 31 further at a room temperature of 27° C., it is desirable from inequality (2) that the melting point Tm of the solder 31 containing the substance 32 be lower than or equal to 227° C.

Furthermore, in order to recover and recrystallize the solder 31 at a lower temperature of 0° C., the melting point Tm of the solder 31 containing the substance 32 is set by the use of $$(0[°\text{ C.}]+273)[K] \geq 0.5 \times (Tm[°\text{ C.}]+273)[K] \quad (3)$$

In order to recover and recrystallize the solder 31 at a temperature of 0° C., it is desirable from inequality (3) that the melting point Tm of the solder 31 containing the substance 32 be lower than or equal to 273° C.

In order to recover and recrystallize the solder 31 further at a temperature of 0° C., the melting point Tm of the solder 31 is set by the use of $$(0[°\text{ C.}]+273)[K] \geq 0.6 \times (Tm[°\text{ C.}]+273)[K] \quad (4)$$

In order to recover and recrystallize the solder 31 further at a temperature of 0° C., it is desirable from inequality (4) that the melting point Tm of the solder 31 containing the substance 32 be lower than or equal to 182° C.

The melting point of the solder 31 used for forming the bonding portion 30, that is to say, a material for the solder 31 used for forming the bonding portion 30 is set on the basis of the maximum temperature at the time of a rise in the temperature which accompanies the operation of the electronic device 1 or the electronic equipment 2, temperature at which the solder 31 recovers and recrystallizes at the time of a fall in the temperature, and the like.

Next, a second embodiment will be described.

In a second embodiment, a solder containing a substance whose crystal structure reversibly changes in temperature rise and fall processes which accompany the operation of an electronic device or electronic equipment will be described in further detail by taking a concrete example.

A case where a solder containing Sn and bismuth (Bi) is used as a solder and where a substance containing indium (In) and silver (Ag) is used as a substance which is contained in the solder and whose crystal structure reversibly changes will be described as an example.

For example, a Sn—Bi eutectic solder (which contains 42 weight percent Sn and 58 weight percent Bi) has a comparatively low melting point of 139° C. and is one of what is called low melting point solders. In addition to the Sn—Bi eutectic solder, various solders, such as a Sn—Bi—Ag solder and a Sn—Bi—Cu solder, have been developed as low melting point solders.

Using a low melting point solder, such as a Sn—Bi based solder, for bonding electronic parts together lowers reflow temperature. For example, if a semiconductor chip and a printed circuit board are bonded together after reflow by the use of a Sn—Ag based solder or a Sn—Ag—Cu based solder higher in melting point than a low melting point solder, the difference in thermal expansion coefficient between the semiconductor chip and the printed circuit board may cause a warp. On the other hand, if a low melting point solder is used for bonding a semiconductor chip and a printed circuit board together and reflow temperature is lowered, a warp of the printed circuit board is reduced. In addition, a fall in the reflow temperature leads to a reduction in power consumption and production costs.

As stated above, however, simply using a low melting point solder for bonding electronic parts together may coarsen crystal grains in the solder due to heat which accompanies continuous or repeated operation of an electronic device or electronic equipment (which is also simply referred to as an "electronic apparatus") including a group of electronic parts bonded together.

For example, it is assumed that the melting point of a solder is Tm. The operating temperature of electronic equipment, such as a computer, may reach (0.8×Tm) to (0.9×Tm). This operating temperature is very high for the solder in a bonding portion between electronic parts. As a result, crystal grains in the solder may coarsen significantly with the operation of the electronic equipment. As stated above, the coarsening of the crystal grains in the solder may lead to variation caused by the anisotropy of the bonding portion or deterioration in bonding reliability based on the fact that a crack tends to propagate. Furthermore, the crystal grains in the solder in the bonding portion may be comparatively fine at the beginning. However, if the crystal grains in the solder have coarsened with the operation of the electronic equipment, it is difficult to return them again to fine crystal grains without remelting.

Accordingly, in order to bond electronic parts together, the above technique is adopted, that is to say, a solder containing a substance whose crystal structure reversibly changes in temperature rise and fall processes which accompany the operation of an electronic device including the electronic parts is used.

For example, a Sn—Bi based solder is used as the solder 31 in the bonding portion 30 between the electronic part 10 and the electronic part 20 illustrated in FIG. 1. $Ag_2In$ is contained as the substance 32 which is contained in the solder 31 and whose crystal structure reversibly changes in temperature rise and fall processes between the temperature before the operation (0 to 30° C., for example) and the temperature at operation time (80 to 100° C., for example) of the electronic device 1 or the electronic equipment 2 (electronic apparatus).

The crystal structure of an $Ag_2In$ simple substance is a γ-brass structure at room temperature (0 to 30° C.) and changes (transforms) to a hexagonal close-packed (HCP) structure at a temperature higher than 300° C. If $Ag_2In$ is contained in, for example, a Sn—Bi eutectic solder, $Ag_2In$ changes its crystal structure and transforms at a temperature between 0 and 100° C.

Figure 3:
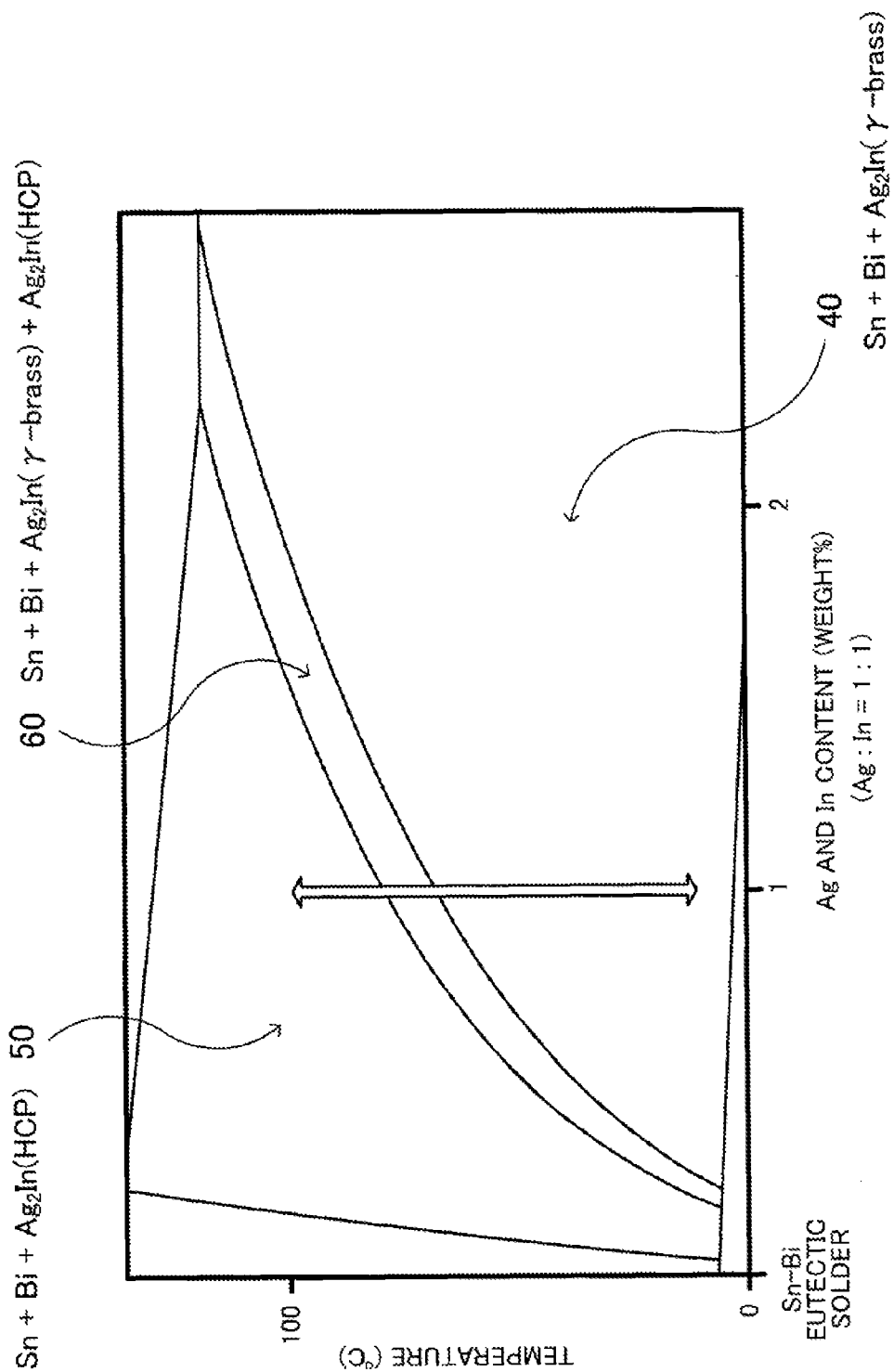
FIG. 3 indicates an example of a calculated phase diagram of a tin(Sn)-bismuth(Bi)-silver(Ag)-indium(In) system according to a second embodiment (part 1)

An example of a calculated phase diagram of a Sn—Bi—Ag—In system according to a second embodiment is indicated in FIG. 3.

FIG. 3 is a calculated phase diagram of a Sn—Bi eutectic solder containing 42 weight percent Sn and 58 weight percent Bi and containing Ag and In at a ratio of 1 to 1. In FIG. 3, a horizontal axis indicates the Ag content (weight %) and the In content (weight %) at the time of considering the Sn—Bi eutectic solder as an origin, and a vertical axis indicates temperature (° C.). For example, if the Ag content and the In content indicated by the horizontal axis are 1 weight %, then the Sn—Bi eutectic solder contains 1 weight % Ag and 1 weight % In.

As can be seen from FIG. 3, there are compositions at which the Sn—Bi eutectic solder containing certain amounts (content indicated by a thick arrow in FIG. 3, for example) of Ag and In may present three states (phases) containing Sn, Bi, and $Ag_2In$ according to temperature. That is to say, there are compositions at which the Sn—Bi eutectic solder containing certain amounts of Ag and In may present three phases: a phase 40 created in a comparatively low temperature range, a phase 50 created in a comparatively high temperature range, and a phase 60 created in a temperature range intermediate between the temperature ranges in which the phases 40 and 50 are created.

The phase 40 created in the comparatively low temperature range is a phase including Sn, Bi, and $Ag_2In$ having the γ-brass structure (($Sn+Bi+Ag_2In$(γ-brass))phase). The phase 50 created in the comparatively high temperature range is a phase including Sn, Bi, and $Ag_2In$ having the HCP structure (($Sn+Bi+Ag_2In$(HCP)) phase). The phase 60 created in the temperature range intermediate between the temperature ranges in which the phases 40 and 50 are created is a phase including Sn, Bi, $Ag_2In$ having the γ-brass structure, and $Ag_2In$ having the HCP structure (($Sn+Bi+Ag_2In$(γ-brass)+$Ag_2In$(HCP)) phase). $Ag_2In$ having the γ-brass structure and $Ag_2In$ having the HCP structure coexist in the phase 60.

With a Sn—Bi based solder containing $Ag_2In$ having a determined composition, $Ag_2In$ transforms from the γ-brass structure to the HCP structure in a temperature rise process between the comparatively low temperature range, such as room temperature, and the comparatively high temperature range at the time of the operation of the electronic device and transforms from the HCP structure to the γ-brass structure in a temperature fall process between the comparatively low temperature range, such as room temperature, and the comparatively high temperature range at the time of the operation of the electronic device. That is to say, with the electronic device including a bonding portion between electronic parts formed by the use of a Sn—Bi based solder containing $Ag_2In$ having a determined composition, the crystal structure of $Ag_2In$ contained in the bonding portion reversibly changes in temperature rise and fall processes which accompany the operation of the electronic device.

When $Ag_2In$ transforms from the γ-brass structure to the HCP structure and transforms from the HCP structure to the γ-brass structure, the volume changes and distortion occurs. Accordingly, if a Sn—Bi based solder containing $Ag_2In$ is used for forming a bonding portion between electronic parts, distortion at the time of the transformation of $Ag_2In$ promotes recovery and recrystallization of the Sn—Bi based solder in a temperature rise process. As a result, the coarsening of crystal grains is suppressed (corresponding to the above steps S1 through S3 in FIG. 2). Distortion at the time of the transformation of $Ag_2In$ also promotes recovery and recrystallization of the Sn—Bi based solder in a temperature fall process. As a result, the coarsening of crystal grains is suppressed (corresponding to the above steps S4 through S6 in FIG. 2).

Furthermore, a bonding portion between electronic parts is formed by the use of a Sn—Bi based solder containing $Ag_2In$ having a determined composition so that the transformation point of $Ag_2In$ will fall within the range of a rise and fall in the temperature which accompany the operation of an electronic device including the bonding portion between the electronic parts. In this case, heat absorption performed at the time of the transition of the heated $Ag_2In$ to a metastable state or a stable state contributes to the relaxation of a rise in the temperature of the bonding portion. Heat absorption performed at the time of the transition of the cooled $Ag_2In$ to the metastable state or the stable state contributes to the promotion of a fall in the temperature of the bonding portion.

Next, the composition of a Sn—Bi based solder containing Ag and In will be described further.

Figure 4:
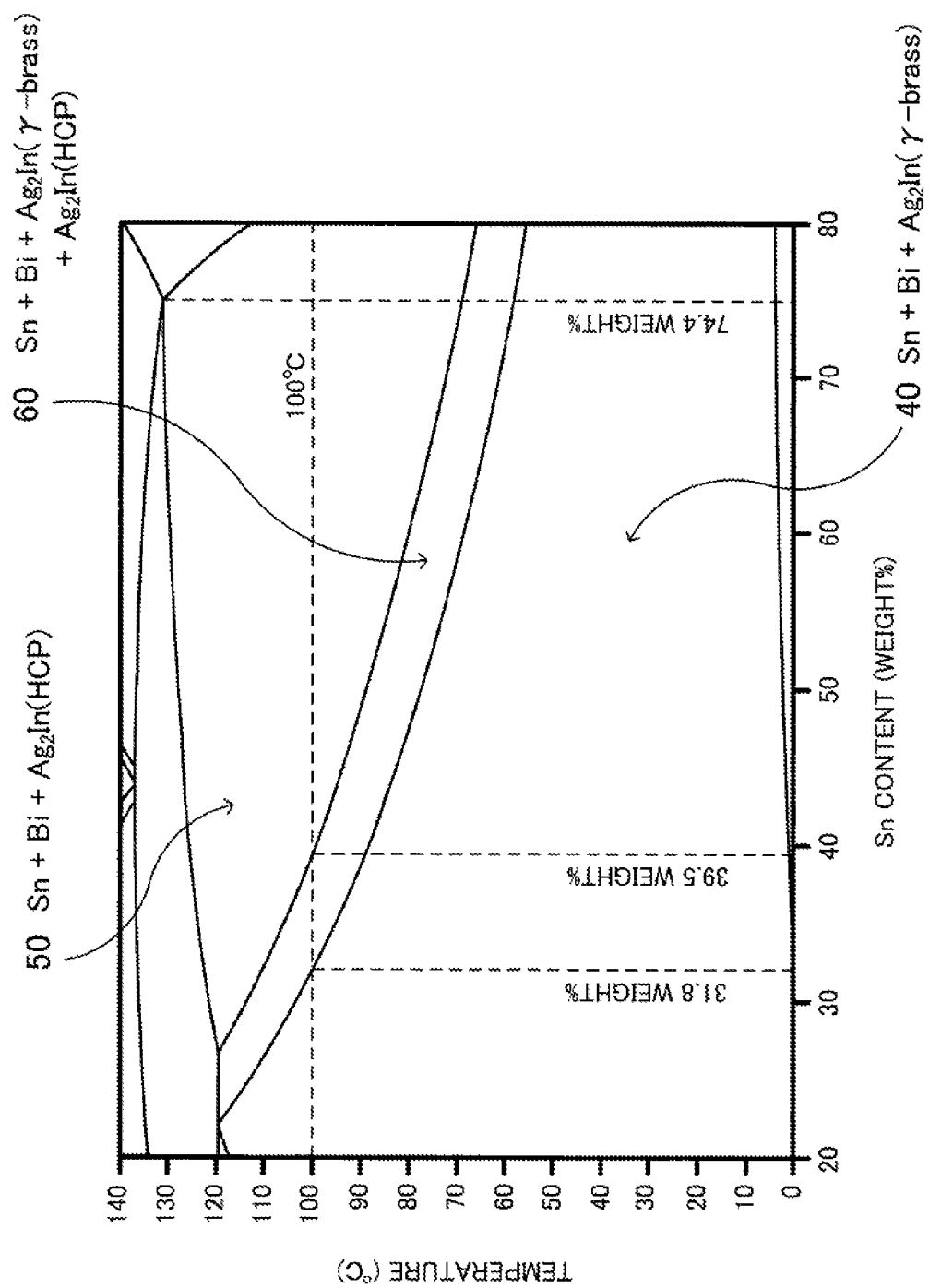
FIG. 4 indicates an example of a calculated phase diagram of the Sn—Bi—Ag—In system according to the second embodiment (part 2)

An example of a calculated phase diagram of the Sn—Bi—Ag—In system according to the second embodiment is indicated in FIG. 4.

FIG. 4 is a calculated phase diagram obtained at the time of changing the Sn content of a Sn—Bi based solder containing Ag and In. In FIG. 4, a horizontal axis indicates the Sn content (weight %) and a vertical axis indicates temperature (° C.). The ratio among Bi, Ag, and In is constant.

A phase 40 in FIG. 4 is a phase including Sn, Bi, and $Ag_2In$ having the γ-brass structure (($Sn+Bi+Ag_2In$(γ-brass)) phase). A phase 50 is a phase including Sn, Bi, and $Ag_2In$ having the HCP structure (($Sn+Bi+Ag_2In$(HCP)) phase). A phase 60 between the phases 40 and 50 is a phase including Sn, Bi, $Ag_2In$ having the γ-brass structure, and $Ag_2In$ having the HCP structure (($Sn+Bi+Ag_2In$(γ-brass)$+Ag_2In$(HCP)) phase). $Ag_2In$ having the γ-brass structure and $Ag_2In$ having the HCP structure coexist in the phase 60.

For example, it is assumed that at the time of the operation of an electronic device including a bonding portion between electronic parts formed by the use of a Sn—Bi based solder containing $Ag_2In$, the temperature of the bonding portion is not higher than or equal to 100° C.

In this case, as can be seen from FIG. 4, if the Sn content is 31.8 weight % or less, $Ag_2In$ does not transform from the γ-brass structure to the HCP structure during the operation of the electronic device during which the temperature of the bonding portion is not higher than or equal to 100° C. That is to say, the transformation from the phase 40 in which $Ag_2In$ has the γ-brass structure to the phase 60 in which $Ag_2In$ having the γ-brass structure and $Ag_2In$ having the HCP structure coexist or the phase 50 in which $Ag_2In$ has the HCP structure does not occur. If $Ag_2In$ contained in the Sn—Bi based solder does not transform from the γ-brass structure to the HCP structure at the time of the operation of the electronic device, distortion caused by transformation does not occur and recovery or recrystallization of the solder is not promoted. As a result, crystal grains may coarsen. If the temperature of the bonding portion included in the electronic device is not higher than or equal to 100° C. at the time of the operation of the electronic device, then the Sn content of the Sn—Bi based solder containing $Ag_2In$ is made higher than 31.8 weight %.

Furthermore, as can be seen from FIG. 4, if the Sn content is higher than 31.8 weight % and lower than or equal to 39.5 weight %, $Ag_2In$ does not totally transform from the γ-brass structure to the HCP structure during the operation of the electronic device during which the temperature of the bonding portion is not higher than or equal to 100° C. That is to say, the transformation from the phase 40 in which $Ag_2In$ has the γ-brass structure to the phase 50 in which $Ag_2In$ has the HCP structure does not occur. However, the transformation from the phase 40 in which $Ag_2In$ has the γ-brass structure to the phase 60 in which $Ag_2In$ having the γ-brass structure and $Ag_2In$ having the HCP structure coexist may occur. Even if $Ag_2In$ contained in the Sn—Bi based solder transforms from the γ-brass structure to the HCP structure not totally but partially at the time of the operation of the electronic device, distortion caused by the transformation promotes recovery and recrystallization of the solder. This suppresses the coarsening of crystal grains.

However, if $Ag_2In$ contained in the Sn—Bi based solder totally transforms from the γ-brass structure to the HCP structure at the time of the operation of the electronic device, a larger amount of distortion is caused by the transformation. This leads to a greater effect of promoting recovery and recrystallization of the solder and a greater effect of suppressing the coarsening of crystal grains. That is to say, the transformation from the phase 40 in which $Ag_2In$ has the γ-brass structure, through the phase 60 in which $Ag_2In$ having the γ-brass structure and $Ag_2In$ having the HCP structure coexist, to the phase 50 in which $Ag_2In$ has the HCP structure has a greater effect of suppressing the coarsening of crystal grains in the solder. If the Sn content is higher than 39.5 weight %, $Ag_2In$ contained in the Sn—Bi based solder may totally transform from the γ-brass structure to the HCP structure.

Therefore, if the temperature of the bonding portion included in the electronic device is not higher than or equal to 100° C. at the time of the operation of the electronic device, then the Sn content of the Sn—Bi based solder containing $Ag_2In$ is made higher than 31.8 weight %, preferably 39.5 weight %.

In addition, as can be seen from FIG. 4, if the Sn content of the Sn—Bi based solder containing $Ag_2In$ is higher than 74.4 weight %, solidus temperature begins to rise. Accordingly, if the Sn content of the Sn—Bi based solder containing $Ag_2In$ is higher than 74.4 weight %, bonding temperature may become high at the time of bonding electronic parts together by the use of it. From the viewpoint of low-temperature bonding, it is desirable that the Sn content of the Sn—Bi based solder containing $Ag_2In$ be lower than or equal to 74.4 weight %.

Figure 5:
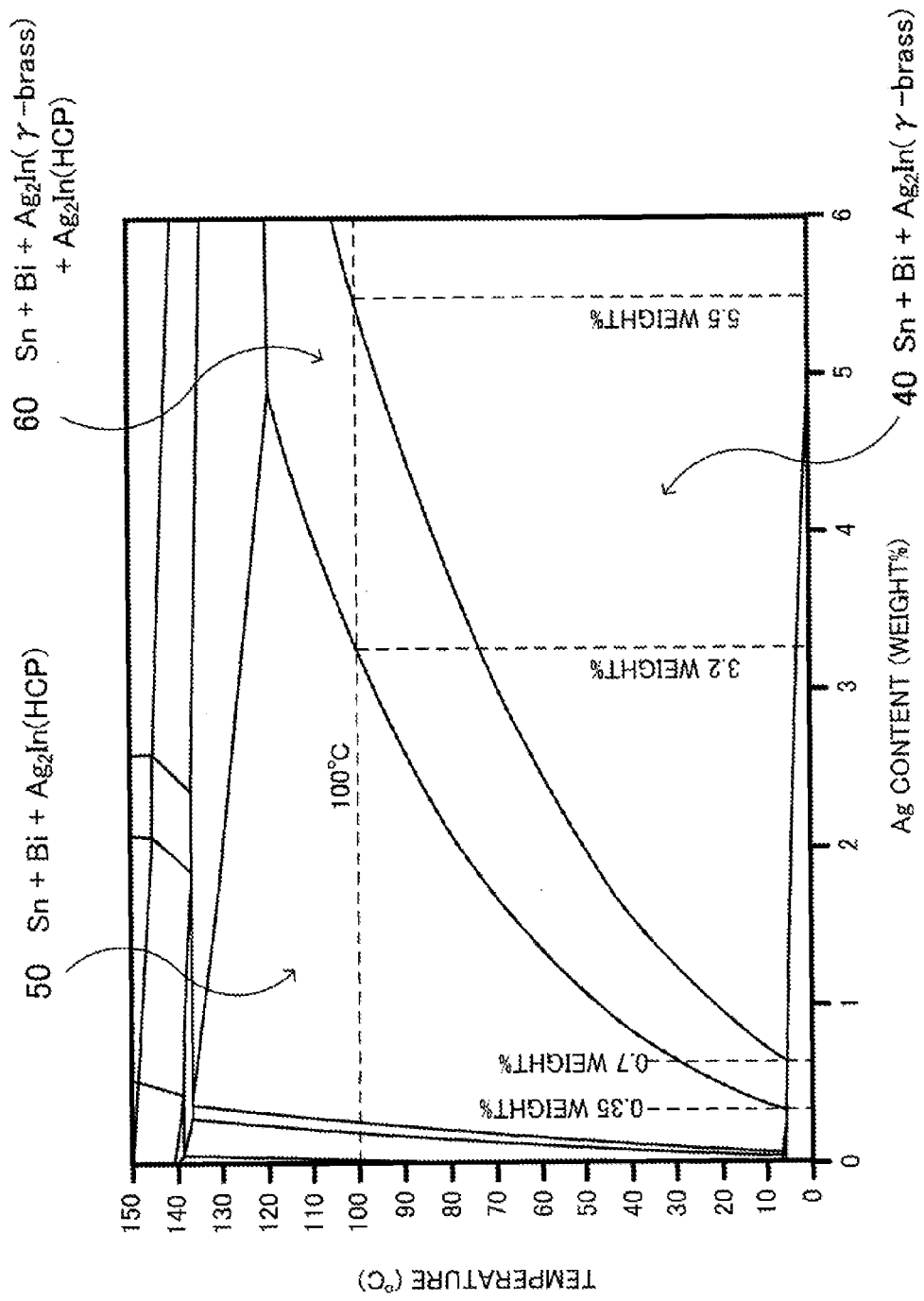
FIG. 5 indicates an example of a calculated phase diagram of the Sn—Bi—Ag—In system according to the second embodiment (part 3)

Furthermore, an example of a calculated phase diagram of the Sn—Bi—Ag—In system according to the second embodiment is indicated in FIG. 5.

FIG. 5 is a calculated phase diagram of a Sn—Bi eutectic solder containing Ag and In at a ratio of 2 to 3. In FIG. 5, a horizontal axis indicates the Ag content (weight %) and a vertical axis indicates temperature (° C.).

A phase 40 in FIG. 5 is a phase including Sn, Bi, and $Ag_2In$ having the γ-brass structure (($Sn+Bi+Ag_2In$(γ-brass)) phase). A phase 50 is a phase including Sn, Bi, and $Ag_2In$ having the HCP structure (($Sn+Bi+Ag_2In$(HCP)) phase). A phase 60 between the phases 40 and 50 is a phase including Sn, Bi, $Ag_2In$ having the γ-brass structure, and $Ag_2In$ having the HCP structure (($Sn+Bi+Ag_2In$(γ-brass)+$Ag_2In$(HCP)) phase). $Ag_2In$ having the γ-brass structure and $Ag_2In$ having the HCP structure coexist in the phase 60.

For example, it is assumed that at the time of the operation of an electronic device including a bonding portion between electronic parts formed by the use of a Sn—Bi based solder containing $Ag_2In$, the temperature of the bonding portion is not higher than or equal to 100° C.

In this case, as can be seen from FIG. 5, if the Ag content is higher than 5.5 weight %, $Ag_2In$ does not transform from the γ-brass structure to the HCP structure during the operation of the electronic device during which the temperature of the bonding portion is not higher than or equal to 100° C. That is to say, the transformation from the phase 40 in which $Ag_2In$ has the γ-brass structure to the phase 60 in which $Ag_2In$ having the γ-brass structure and $Ag_2In$ having the HCP structure coexist or the phase 50 in which $Ag_2In$ has the HCP structure does not occur. Accordingly, distortion caused by the transformation of $Ag_2In$ does not occur at the time of the operation of the electronic device and recovery or recrystallization of the solder is not promoted. As a result, crystal grains may coarsen. If the temperature of the bonding portion included in the electronic device is not higher than or equal to 100° C. at the time of the operation of the electronic device, then the Ag content of the Sn—Bi based solder containing $Ag_2In$ is made lower than or equal to 5.5 weight %.

Furthermore, as can be seen from FIG. 5, if the Ag content is higher than 3.2 weight % and lower than or equal to 5.5 weight %, $Ag_2In$ does not totally transform from the γ-brass structure to the HCP structure during the operation of the electronic device during which the temperature of the bonding portion is not higher than or equal to 100° C. That is to say, the transformation from the phase 40 in which $Ag_2In$ has the γ-brass structure to the phase 50 in which $Ag_2In$ has the HCP structure does not occur. However, the transformation from the phase 40 in which $Ag_2In$ has the γ-brass structure to the phase 60 in which $Ag_2In$ having the γ-brass structure and $Ag_2In$ having the HCP structure coexist may occur. Even if $Ag_2In$ contained in the Sn—Bi based solder transforms from the γ-brass structure to the HCP structure not totally but partially at the time of the operation of the electronic device, distortion caused by the transformation promotes recovery and recrystallization of the solder. This suppresses the coarsening of crystal grains.

However, if $Ag_2In$ contained in the Sn—Bi based solder totally transforms from the γ-brass structure to the HCP structure at the time of the operation of the electronic device, a larger amount of distortion is caused by the transformation. This leads to a greater effect of promoting recovery and recrystallization of the solder and a greater effect of suppressing the coarsening of crystal grains. That is to say, the transformation from the phase 40 in which $Ag_2In$ has the γ-brass structure, through the phase 60 in which $Ag_2In$ having the γ-brass structure and $Ag_2In$ having the HCP structure coexist, to the phase 50 in which $Ag_2In$ has the HCP structure has a greater effect of suppressing the coarsening of crystal grains in the solder. If the Sn content is lower than or equal to 3.2 weight %, $Ag_2In$ contained in the Sn—Bi based solder may totally transform from the γ-brass structure to the HCP structure.

Therefore, if the temperature of the bonding portion included in the electronic device is not higher than or equal to 100° C. at the time of the operation of the electronic device, then the Ag content of the Sn—Bi based solder containing $Ag_2In$ is made 5.5 weight % or less, preferably 3.2 weight % or less or 3 weight % or less.

From the same viewpoint, if the temperature of the bonding portion included in the electronic device is not higher than or equal to 100° C. at the time of the operation of the electronic device, then the Ag content of the Sn—Bi based solder containing $Ag_2In$ is made higher than 0.35 weight %, preferably higher than 0.7 weight %. If the Ag content of the Sn—Bi based solder containing $Ag_2In$ is lower than or equal to 0.35 weight %, the Sn—Bi based solder containing $Ag_2In$ exists only in the phase 50 at the time of the operation of the electronic device. If the Ag content of the Sn—Bi based solder containing $Ag_2In$ is higher than 0.35 weight % and is lower than or equal to 0.7 weight %, a transformation between the phase 60 and the phase 50 occurs at the time of the operation of the electronic device. However, if the Ag content of the Sn—Bi based solder containing $Ag_2In$ is higher than 0.35 weight % and is lower than or equal to 0.7 weight %, a transformation between the phase 40 and the phase 50 does not occur at the time of the operation of the electronic device.

Furthermore, if the content of In contained in the Sn—Bi based solder together with Ag is higher than 3 weight %, the solidus temperature significantly falls and the Sn—Bi based solder melts at the time of the operation of the electronic device including the bonding portion formed by the use of the Sn—Bi based solder. This leads to a deterioration in the reliability of the electronic device. It is desirable that the In content of the Sn—Bi based solder containing $Ag_2In$ be lower than or equal to 3 weight %.

Figure 6:
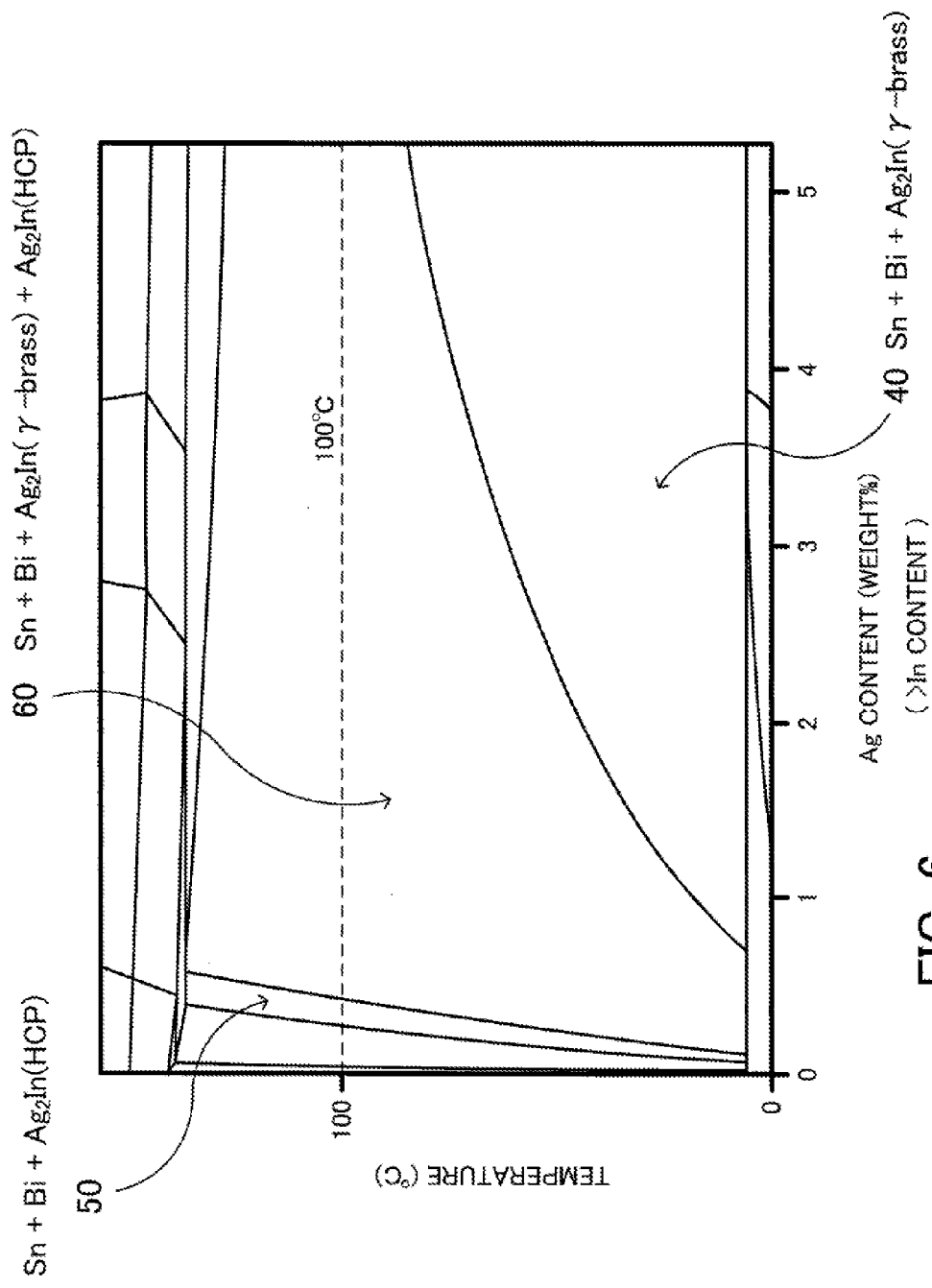
FIG. 6 indicates an example of a calculated phase diagram of the Sn—Bi—Ag—In system according to the second embodiment (part 4)

Furthermore, an example of a calculated phase diagram of the Sn—Bi—Ag—In system according to the second embodiment is indicated in FIG. 6.

FIG. 6 is a calculated phase diagram of a Sn—Bi eutectic solder containing Ag and In on the condition that the Ag content be higher than the In content. The Ag content is lower than or equal to 3 weight % and the Sn—Bi eutectic solder contains Ag and In at a ratio of 2 to 1. In FIG. 6, a horizontal axis indicates the Ag content (>In content) (weight %) and a vertical axis indicates temperature (° C.).

A phase 40 in FIG. 6 is a phase including Sn, Bi, and $Ag_2In$ having the γ-brass structure (($Sn+Bi+Ag_2In$(γ-brass)) phase). A phase 50 is a phase including Sn, Bi, and $Ag_2In$ having the HCP structure (($Sn+Bi+Ag_2In$(HCP)) phase). A phase 60 between the phases 40 and 50 is a phase including Sn, Bi, $Ag_2In$ having the γ-brass structure, and $Ag_2In$ having the HCP structure (($Sn+Bi+Ag_2In$(γ-brass)+$Ag_2In$(HCP)) phase). $Ag_2In$ having the γ-brass structure and $Ag_2In$ having the HCP structure coexist in the phase 60.

As can be seen from FIG. 6, if the In content is lower than the Ag content, there is a wide region in which the phase 60 including $Ag_2In$ having the γ-brass structure and $Ag_2In$ having the HCP structure appears. The transformation from the phase 40 in which $Ag_2In$ has only the γ-brass structure into the phase 50 in which $Ag_2In$ has only the HCP structure does not occur regardless of the Ag content during the operation of an electronic device during which the temperature of a bonding portion is not higher than or equal to 100° C. Accordingly, the effect of promoting recovery and recrystallization of the solder and suppressing the coarsening of crystal grains by distortion caused by the transformation may become smaller.

As stated above, it is desirable that the In content of the Sn—Bi based solder containing $Ag_2In$ be lower than or equal to 3 weight %. In addition, according to information from FIG. 6, it is desirable that the In content of the Sn—Bi based solder containing $Ag_2In$ be equal to or higher than the Ag content.

According to information from FIGS. 4 through 6, a material containing determined amounts of Sn, Ag, and In, and the balance Bi or the balance Bi and inevitable impurities is used as a solder containing a substance whose crystal structure reversibly changes in temperature rise and fall processes in a determined temperature range.

FIGS. 4 through 6 indicate examples of setting a desirable Sn, Ag, and In content on the assumption that the temperature of the bonding portion is not higher than or equal to 100° C. at the time of the operation of the electronic device including the bonding portion between electronic parts formed by the use of the Sn—Bi based solder containing $Ag_2In$. A desirable Sn, Ag, and In content changes according to a change in the temperature of the electronic device at operation time or the temperature of the bonding portion assumed on the basis of the temperature of the electronic device at operation time. The composition (Sn, Bi, Ag, In, etc) of the Sn—Bi based solder containing $Ag_2In$ depends on assumed temperature of the bonding portion. The composition (Sn, Bi, Ag, In, etc) is set so that the transformation from the phase 40 into the phase 60 or from the phase 40, through the phase 60, into the phase 50 will occur in the temperature rise process which accompanies the operation of the electronic device and so that the transformation from the phase 50 into the phase 60 or from the phase 50, through the phase 60, into the phase 40 will occur in the temperature fall process.

Next, a result obtained by performing heat treatment on the Sn—Bi based solder containing $Ag_2In$ will be described.

FIGS. 7A, 7B, 8A, 8B, and 9 indicate examples of a scanning electron microscope (SEM) image of the Sn—Bi based solder containing $Ag_2In$ according to the second embodiment.

Figure 7A:
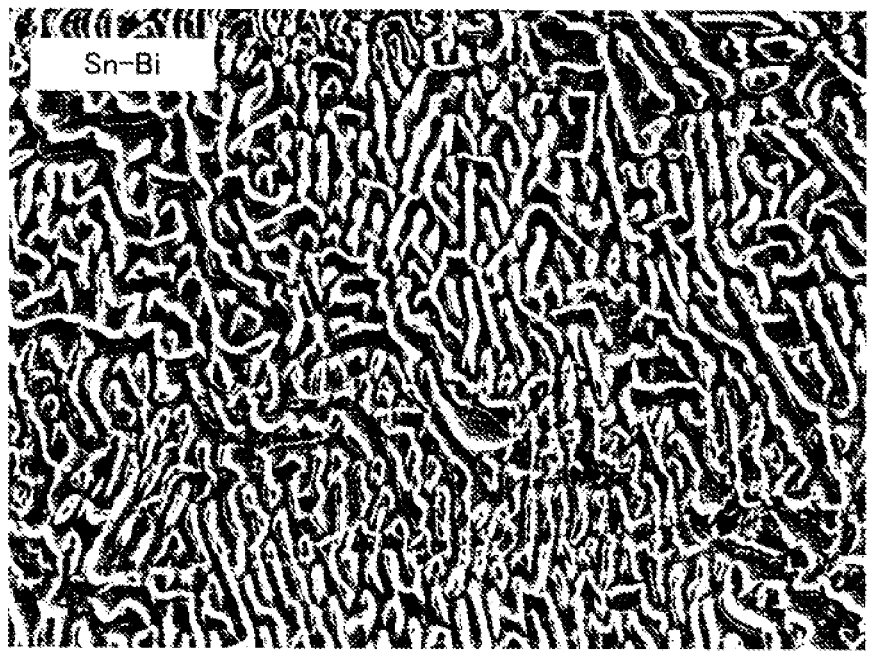
FIGS. 7A and 7B are examples of a scanning electron microscope image of the Sn—Bi based solder containing $Ag_2In$ according to the second embodiment (part 1)
Figure 7B:
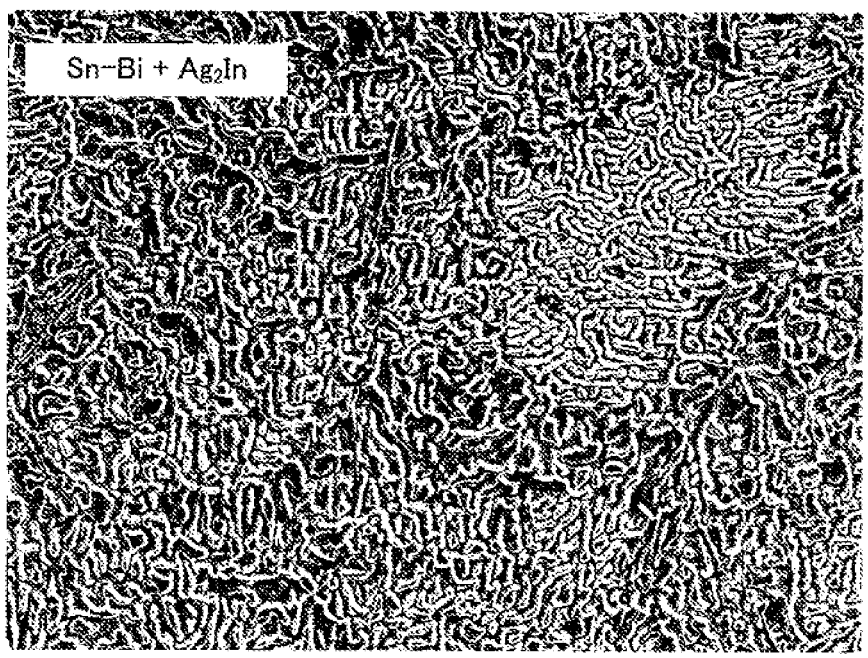

FIG. 7A is a SEM image of a Sn—Bi eutectic solder (Sn—Bi) obtained after heating it to 120° C. and cooling it from 120° C. to room temperature. FIG. 7B is a SEM image of a Sn—Bi eutectic solder containing 1.5 weight % $Ag_2In$ (Sn—Bi+$Ag_2In$) obtained after heating it to 120° C. and cooling it from 120° C. to room temperature. It turns out that compared with the Sn—Bi eutectic solder of FIG. 7A, there are fine crystal grains in the Sn—Bi based solder containing $Ag_2In$ of FIG. 7B.

Figure 8A:
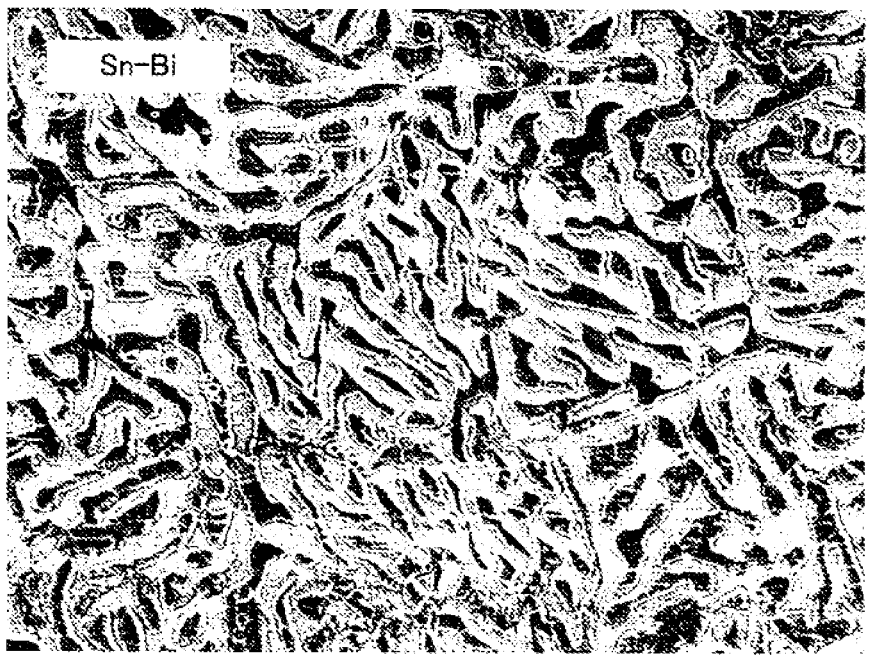
FIGS. 8A and 8B are examples of a scanning electron microscope image of the Sn—Bi based solder containing $Ag_2In$ according to the second embodiment (part 2)
Figure 8B:
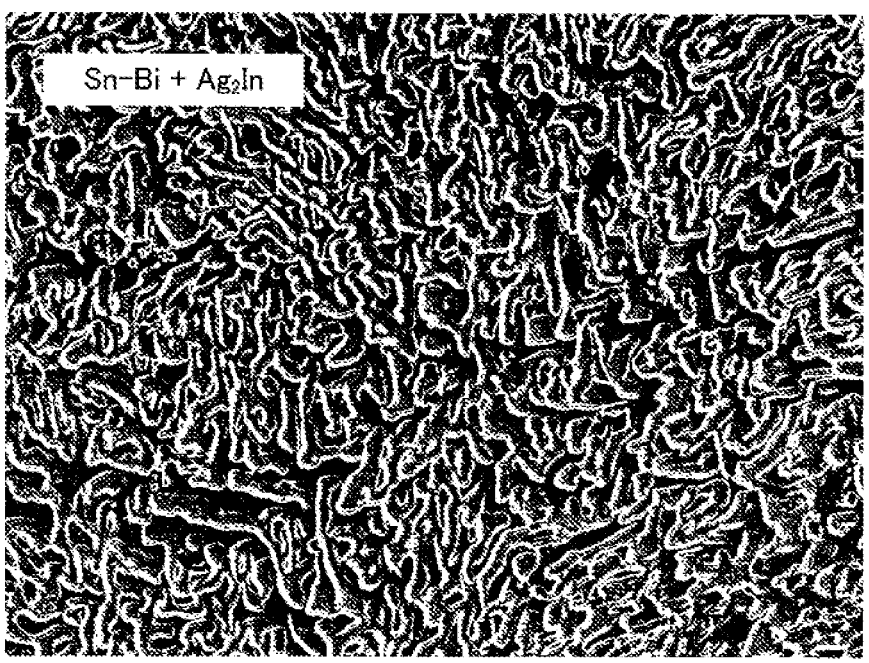

Furthermore, FIG. 8A is a SEM image of a Sn—Bi eutectic solder (Sn—Bi) obtained after heat-treating it for 12 hours at a temperature of 100° C. and cooling it to room temperature. FIG. 8B is a SEM image of a Sn—Bi eutectic solder containing 1.5 weight % $Ag_2In$ (Sn—Bi+$Ag_2In$) obtained after heat-treating it for 12 hours at a temperature of 100° C. and cooling it to room temperature. It turns out that the size of crystal grains in the Sn—Bi eutectic solder of FIG. 8A approximately doubles and that the crystal grains have coarsened. On the other hand, it turns out that the coarsening of crystal grains in the Sn—Bi based solder containing $Ag_2In$ of FIG. 8B is suppressed and that there are fine crystal grains.

Figure 9:
FIG. 9 is an example of a scanning electron microscope image of the Sn—Bi based solder containing $Ag_2In$ according to the second embodiment (part 3)

FIG. 9 is an enlarged SEM image of the Sn—Bi based solder containing $Ag_2In$ obtained after the heat treatment. The formation of fine crystal grains 71 is confirmed around $Ag_2In$ 70 which has transformed.

As has been described, by making a Sn—Bi based solder contain $Ag_2In$ as a substance whose crystal structure reversibly changes in temperature rise and fall processes which accompany the operation of an electronic device, distortion caused by a change in the crystal structure promotes recovery and recrystallization of the solder. As a result, the coarsening of crystal grains is suppressed. Using a Sn—Bi based solder contain $Ag_2In$ for forming a bonding portion between electronic parts suppresses property variations or easiness of crack propagation caused by the coarsening of crystal grains. As a result, a bonding portion with high reliability is realized. Furthermore, a highly reliable electronic device including such a bonding portion is realized.

A third embodiment will now be described.

Figure 10:
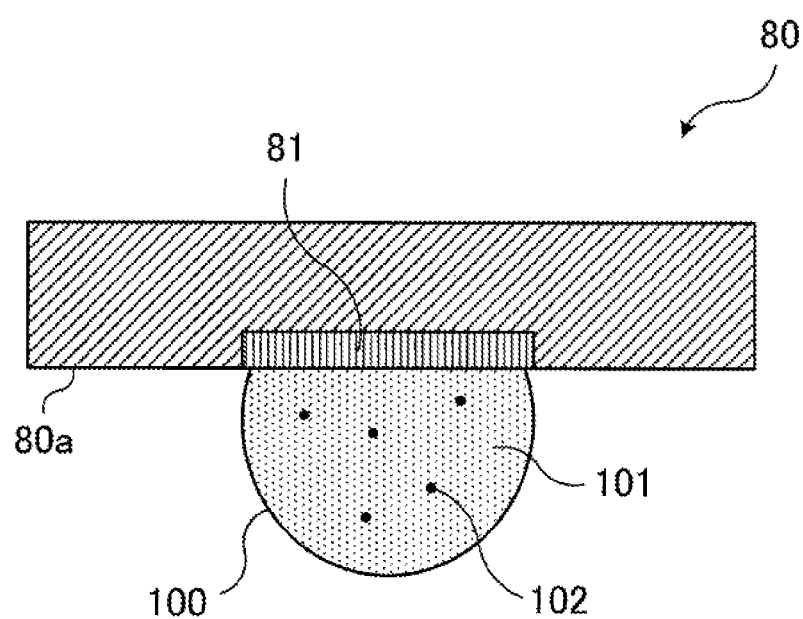
FIG. 10 illustrates an example of an electronic part according to a third embodiment.

FIG. 10 illustrates an example of an electronic part according to a third embodiment. FIG. 10 schematically illustrates a section of an important part of an example of an electronic part according to a third embodiment.

An electronic part 80 illustrated in FIG. 10 is a semiconductor chip, a semiconductor package, a circuit board, or the like. The electronic part 80 has an electrode 81 in a surface 80a which is electrically connected to a transistor or a conductor portion, such as a wiring or a via, which is not illustrated and which is internally formed. The electrode 81 is made of, for example, Cu. The electrode 81 may have in its surface a barrier metal layer made of Ni or the like. If Ni is used for forming the barrier metal layer, the barrier metal layer having a thickness of about 4 to 6 µm is formed by, for example, electroless plating. In this case, the Ni barrier metal layer formed may contain phosphorus (P) contained in a plating solution.

Furthermore, the electronic part 80 has a bump 100 formed over the electrode 81. The bump 100 is formed by the use of a solder 101, such as the above Sn—Bi based solder containing $Ag_2In$, containing a substance 102 whose crystal structure reversibly changes in temperature rise and fall processes which accompany the operation of an electronic device or electronic equipment in which the electronic part 80 is used.

The use of the electronic part 80 having the above bump 100 suppresses the coarsening of crystal grains in the solder 101 at the time of and after bonding the electronic part 80 and another electronic part together.

Figure 11A:
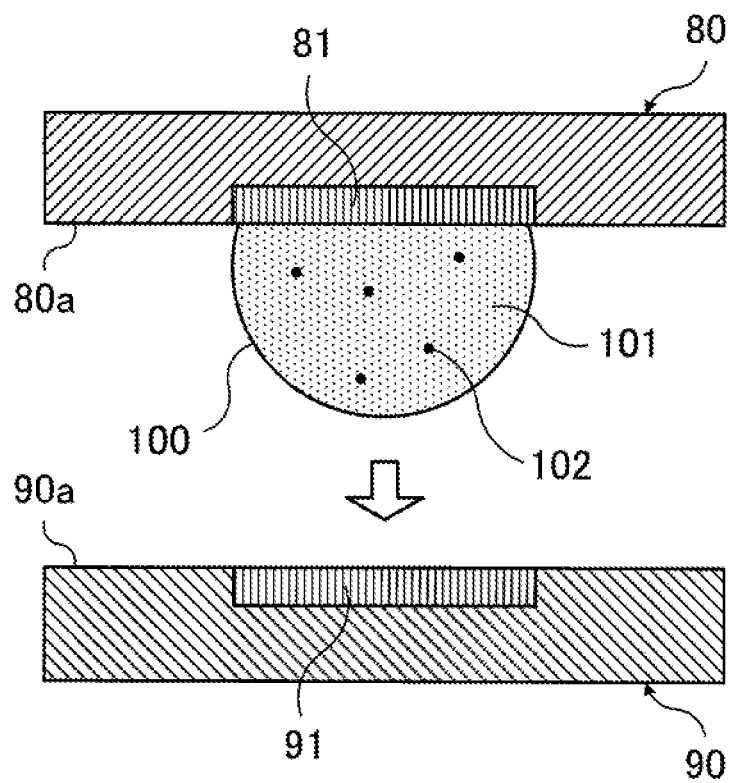
FIGS. 11A and 11B illustrate an example of a process for bonding the electronic part according to the third embodiment.
Figure 11B:
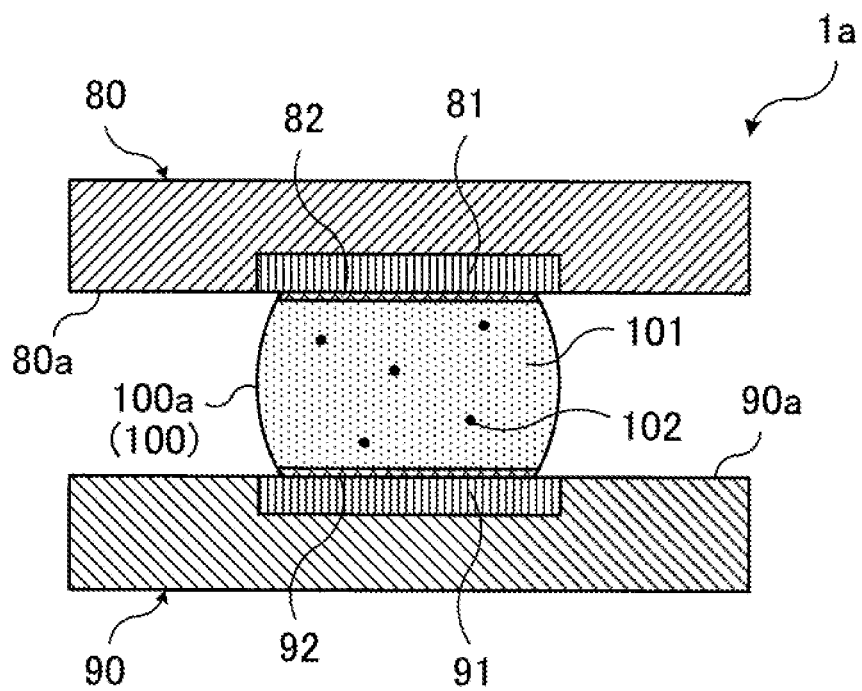

FIGS. 11A and 11B illustrate an example of a process for bonding the electronic part according to the third embodiment. Each of FIGS. 11A and 11B schematically illustrates a section of an important part of an example of a process for bonding the electronic part according to the third embodiment.

As illustrated in FIG. 11A, the electronic part 80 including the bump 100 formed over the electrode 81 and an electronic part 90 having an electrode 91 formed in a position corresponding to the electrode 81 are prepared. The electronic part 90 is a semiconductor chip, a semiconductor package, a circuit board, or the like. The electrode 91 is made of, for example, Cu. The electrode 91 may have in its surface a barrier metal layer made of Ni or the like. The barrier metal layer made of Ni may contain P contained in a plating solution used at the time of forming the barrier metal layer by electroless plating.

As illustrated in FIG. 11A, the prepared electronic part 80 and electronic part 90 are arranged. In this case, each of the surface 80a on the electrode 81 side and a surface 90a on the electrode 91 side is placed opposite the other and each of the electrode 81 and the electrode 91 is aligned with the other.

After that, the electronic part 80 and the electronic part 90 are heated and pressurized. By doing so, as illustrated in FIG. 11B, the bump 100 of the electronic part 80 and the electrode 91 of the electronic part 90 are bonded together. Heating at bonding time is performed at a temperature higher than the melting point of the solder 101 used for forming the bump 100. For example, this heating is performed at a temperature of about 150 to 200° C. The bump 100 is melted by this heating and is then cooled to, for example, room temperature. As a result, the bump 100 is solidified.

As illustrated in FIG. 11B, an intermetallic compound 82 and an intermetallic compound 92 may be formed at an interface between the bump 100 and the electrode 81 and an interface between the bump 100 and the electrode 91 respectively. If the bump 100 is formed by the use of a Sn—Bi based solder containing $Ag_2In$ and the electrode 81 and the electrode 91 are formed by the use of Cu, the intermetallic compound 82 and the intermetallic compound 92 each containing two or more of Sn, Bi, Ag, In, and Cu may be formed. If the bump 100 is formed by the use of a Sn—Bi based solder containing $Ag_2In$ and Ni barrier metal layers are formed in the front surfaces of the electrode 81 and the electrode 91, the intermetallic compound 82 and the intermetallic compound 92 each containing two or more of Sn, Bi, Ag, In, and Ni may be formed.

The bump 100 is formed by the use of the solder 101 containing the substance 102 whose crystal structure reversibly changes. Accordingly, distortion caused by a change in the crystal structure of the substance 102 suppresses the coarsening of crystal grains in the solder 101 in a temperature rise process at bonding time. Similarly, distortion caused by a change in the crystal structure of the substance 102 suppresses the coarsening of crystal grains in the solder 101 in a temperature fall process. As a result, an electronic device 1a in which the electronic part 80 and the electronic part 90 are bonded together by a bonding portion 100a containing the solder 101 in which crystal grains are fine is obtained.

After that, the temperature of the bonding portion 100a between the electronic part 80 and the electronic part 90 formed by the use of the solder 101 containing the substance 102 may rise with the operation of the electronic device 1a or electronic equipment (electronic apparatus) in which the electronic device 1a is used, and may fall after the operation. Distortion caused by a change in the crystal structure of the substance 102 contained in the solder 101 of the bonding portion 100a suppresses the coarsening of crystal grains in a temperature rise process at the time of the operation of the electronic device 1a or the like. Similarly, distortion caused by a change in the crystal structure of the substance 102 suppresses the coarsening of crystal grains in a temperature fall process after the operation.

As a result, property variations or easiness of crack propagation caused by the coarsening of crystal grains is suppressed. Accordingly, the bonding portion 100a with high reliability is realized. Furthermore, the highly reliable electronic device 1a or the like including the bonding portion 100a is realized.

In the third embodiment plural electrodes 81 and plural electrodes 91 may be formed in pairs in the electronic part 80 and the electronic part 90 respectively. In that case, the bump 100 is formed over each of the plural electrodes 81 of the electronic part 80.

Furthermore, in the third embodiment a combination of the electronic part 80 and the electronic part 90 bonded together by the bump 100 may be a combination of a semiconductor chip and a circuit board, a combination of a semiconductor package and a circuit board, a combination of a semiconductor chip and a semiconductor package, or the like. Furthermore, a combination of the electronic part 80 and the electronic part 90 bonded together by the bump 100 may be a combination of semiconductor chips, a combination of semiconductor packages, a combination of circuit boards, or the like. In addition, a combination of the electronic part 80 and the electronic part 90 bonded together by the bump 100 may be a combination of electronic parts after dicing, a combination of an electronic part before dicing and an electronic part after dicing, or a combination of electronic parts before dicing.

A fourth embodiment will now be described.

Figure 12A:
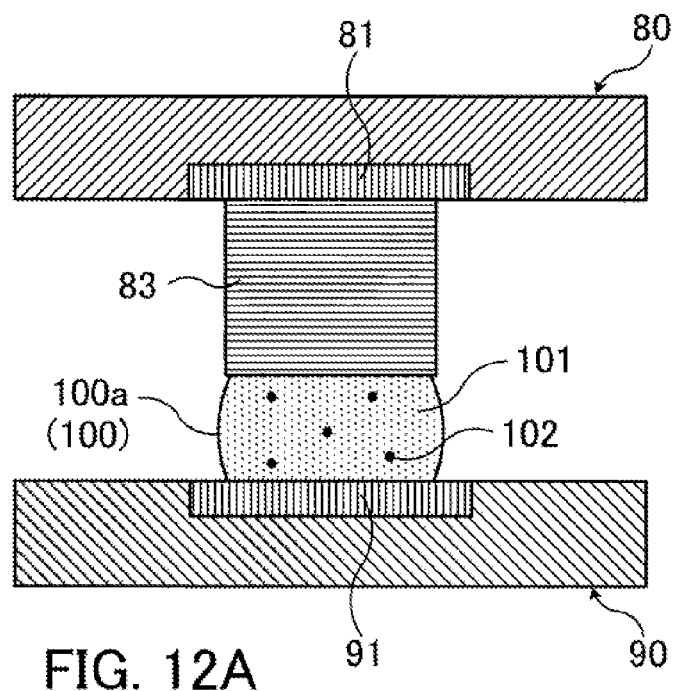
FIGS. 12A and 12B illustrate an example of an electronic device according to a fourth embodiment.
Figure 12B:
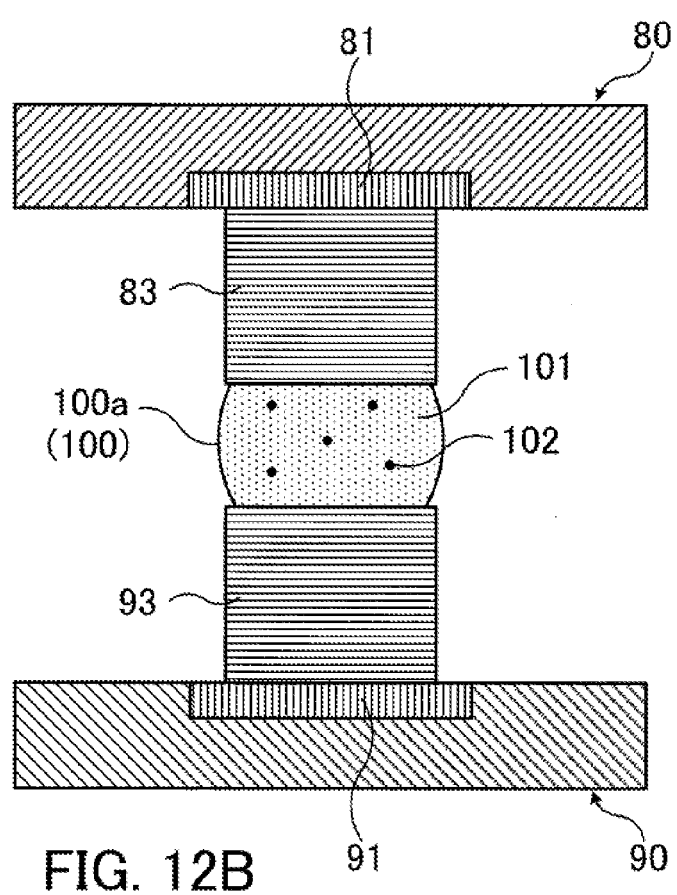

FIGS. 12A and 12B illustrate an example of an electronic device according to a fourth embodiment. FIG. 12A schematically illustrates a section of an important part of a first example of the structure of an electronic device according to a fourth embodiment. FIG. 12B schematically illustrates a section of an important part of a second example of the structure of an electronic device according to a fourth embodiment.

In the above third embodiment, for example, a case where the electrode 81 of the electronic part 80 and the electrode 91 of the electronic part 90 are bonded together by the bump 100 (bonding portion 100a) is taken as an example. Furthermore, as illustrated in FIG. 12A, the following case is possible. A post 83 is formed over an electrode 81 of an electronic part 80. A bump 100 formed over the post 83 and an electrode 91 of an electronic part 90 are bonded together. In addition, as illustrated in FIG. 12B, the following case is possible. A post 83 is formed over an electrode 81 of an electronic part 80. A post 93 is formed over an electrode 91 of an electronic part 90. A bump 100 formed over the post 83 of the electronic part 80 and the post 93 of the electronic part 90 are bonded together. The post 83 and the post 93 are formed by the use of a conductor material such as Cu, Ni, or Au.

A bonding portion 100a between the post 83 and the electrode 91 (FIG. 12A) or a bonding portion 100a between the post 83 and the post 93 (FIG. 12B) may be formed by the use of the solder 101 containing the substance 102 whose crystal structure reversibly changes.

A fifth embodiment will now be described.

Figure 13:
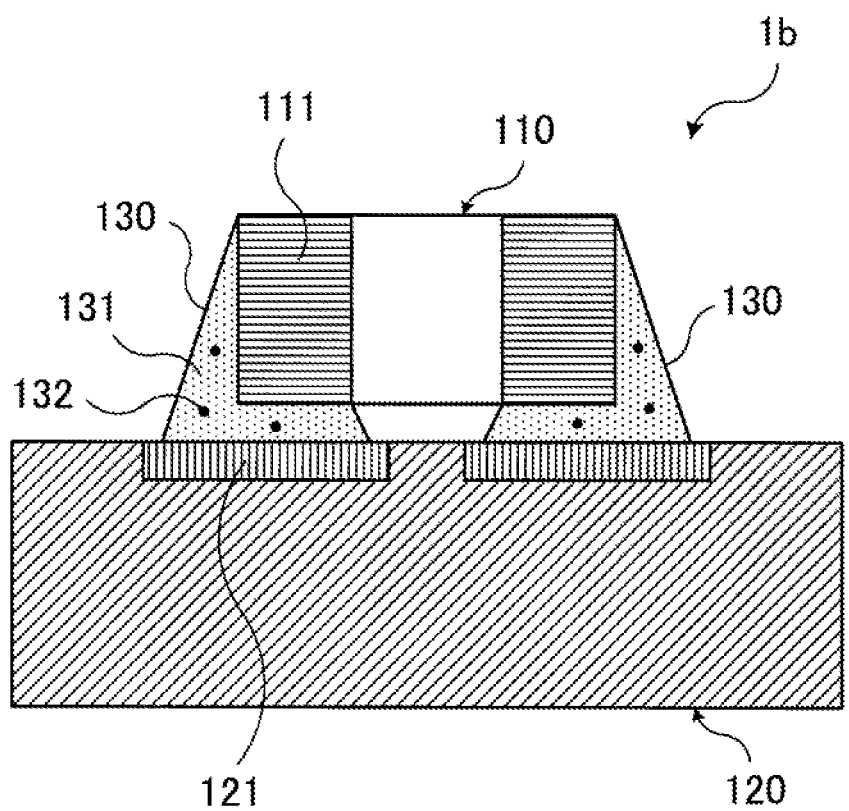
FIG. 13 illustrates an example of an electronic device according to a fifth embodiment.

FIG. 13 illustrates an example of an electronic device according to a fifth embodiment. FIG. 13 schematically illustrates a section of an important part of an example of an electronic device according to a fifth embodiment.

Bonding a chip part (electronic part) 110, such as a chip capacitor, and another electronic part 120 together illustrated in FIG. 13 may be performed by the use of a solder 131 containing a substance 132 whose crystal structure reversibly changes. An electrode 111 of the chip part 110 and an electrode 121 of the electronic part 120 are bonded together by the use of the solder 131 containing the substance 132 to form an electronic device 1b.

The temperature of a bonding portion 130 between the chip part 110 and the electronic part 120 formed by the use of the solder 131 containing the substance 132 may rise with the operation of the electronic device 1b including the bonding portion 130 or electronic equipment (electronic apparatus) in which the electronic device 1b is used, and may fall after the operation. Distortion caused by a change in the crystal structure of the substance 132 contained in the solder 131 of the bonding portion 130 suppresses the coarsening of crystal grains in a temperature rise process at the time of the operation of the electronic device 1b or the like and a temperature fall process after the operation.

As a result, the bonding portion 130 with high reliability is realized. Furthermore, the highly reliable electronic device 1b or the like including the bonding portion 130 is realized.

The electrode 111 of the chip part 110 may be formed by the use of the solder 131 containing the substance 132 and the electrode 111 (terminal) formed by the use of the solder 131 containing the substance 132 may be bonded to the electrode 121 of the electronic part 120.

A semiconductor chip, a semiconductor package, a pseudo-system-on-a-chip (SoC), a circuit board, or the like is used as each of the electronic parts 10, 20, 80, 90, 120, etc described in the above first through fifth embodiments. Examples of the structure of a semiconductor chip, a semiconductor package, and a circuit board will be described by reference to FIGS. 14 through 17.

Figure 14:
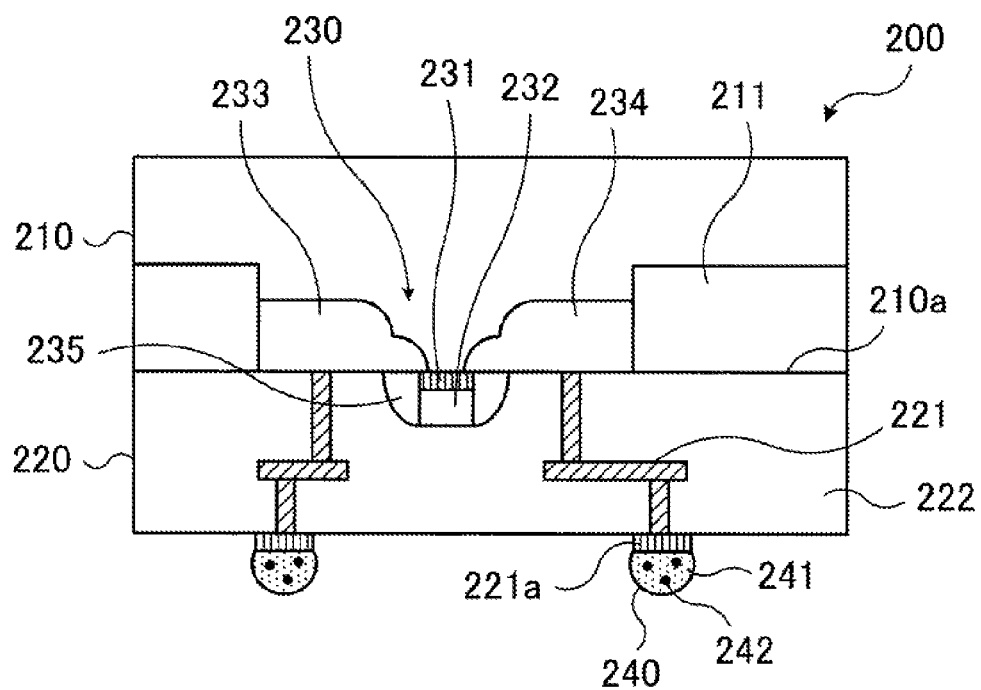
FIG. 14 illustrates an example of the structure of a semiconductor chip.

FIG. 14 illustrates an example of the structure of a semiconductor chip. FIG. 14 schematically illustrates a section of an important part of an example of a semiconductor chip.

A semiconductor chip 200 illustrated in FIG. 14 includes a semiconductor substrate 210 in which circuit elements, such as transistors, are formed and a wiring layer 220 formed over a front surface 210a of the semiconductor substrate 210.

A silicon (Si) substrate, a germanium (Ge) substrate, a silicon germanium (SiGe) substrate, a gallium arsenide (GaAs) substrate, indium phosphide (InP) substrate, or the like is used as the semiconductor substrate 210. Circuit elements, such as transistors, capacitors, and resistors, are formed in the semiconductor substrate 210. In FIG. 14, a metal oxide semiconductor (MOS) transistor 230 is illustrated as an example.

The MOS transistor 230 is formed in an element region demarcated by isolation regions 211 formed in the semiconductor substrate 210. The MOS transistor 230 includes a gate electrode 232 formed over the semiconductor substrate 210 with a gate insulating film 231 therebetween and a source region 233 and a drain region 234 formed in the semiconductor substrate 210 on both sides of the gate electrode 232. A spacer (side wall) 235 made of an insulating film is formed on a sidewall of the gate electrode 232.

The wiring layer 220 is formed over the semiconductor substrate 210 in which the MOS transistor 230 and the like are formed. The wiring layer 220 includes a conductor portion (wiring, a via, or the like) 221 electrically connected to the MOS transistor 230 or the like formed in the semiconductor substrate 210 and an insulating portion 222 which covers the conductor portion 221. The conductor portion 221 is formed by the use of a conductor material such as Cu. The insulating portion 222 is formed by the use of an inorganic insulating material, such as SiO, or an organic insulating material, such as resin.

A terminal 221a electrically connected to the conductor portion 221 is formed over the wiring layer 220. The terminal 221a is an electrode (pad) or a post formed over an electrode. A bump 240 is formed over the terminal 221a. The bump 240 is formed by the use of a solder 241 containing a substance 242 whose crystal structure reversibly changes in temperature rise and fall processes which accompany the operation of an electronic device in which the semiconductor chip 200 is used or electronic equipment in which the electronic device is used.

Figure 15A:
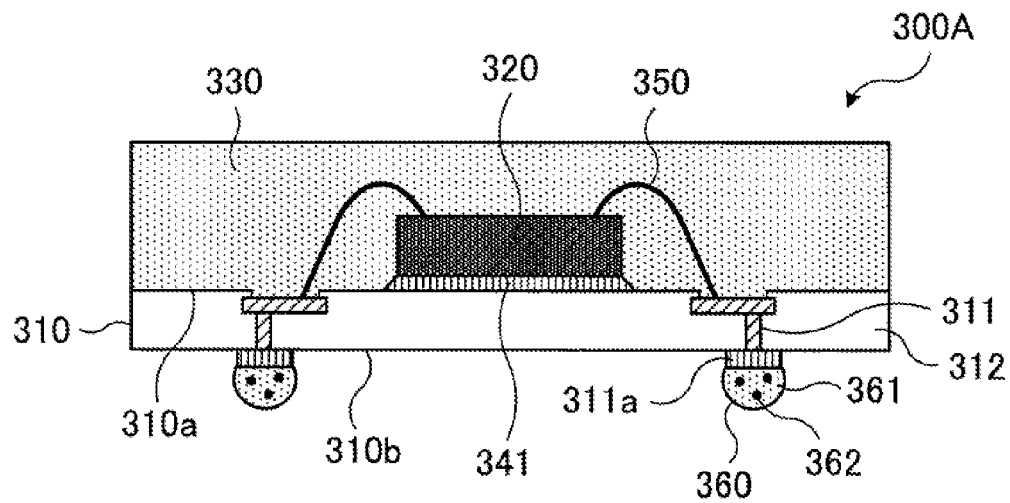
FIGS. 15A and 15B illustrate examples of the structure of a semiconductor package.
Figure 15B:
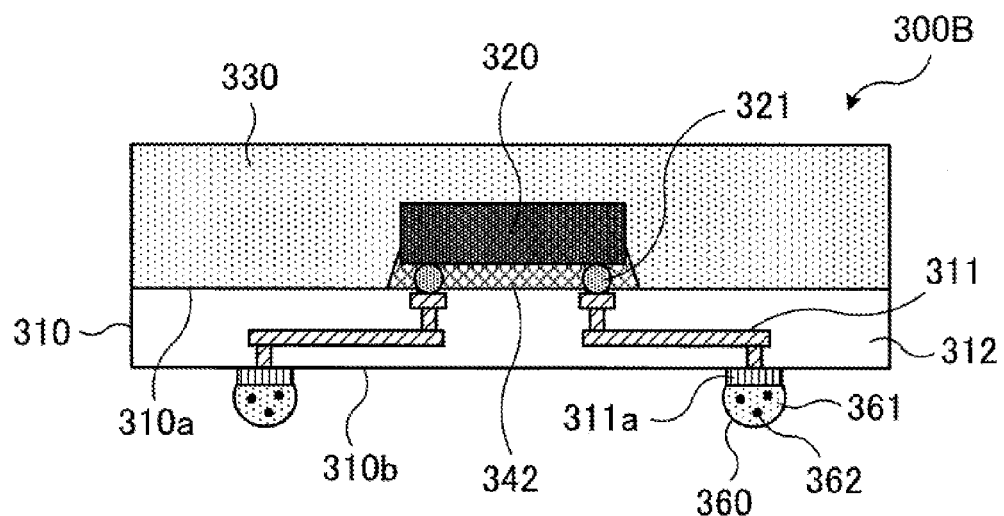

FIGS. 15A and 15B illustrate examples of the structure of a semiconductor package. Each of FIGS. 15A and 15B schematically illustrates a section of an important part of an example of a semiconductor package.

Each of a semiconductor package 300A illustrated in FIG. 15A and a semiconductor package 300B illustrated in FIG. 15B includes a package substrate 310, a semiconductor chip 320 mounted over the package substrate 310, and a sealing layer 330 which seals the semiconductor chip 320.

For example, a printed circuit board is used as the package substrate 310. The package substrate 310 includes a conductor portion (wiring, a via, or the like) 311 and an insulating portion 312 which covers the conductor portion 311. The conductor portion 311 is formed by the use of a conductor material such as Cu. The insulating portion 312 is formed by the use of a resin material, such as phenol resin, epoxy resin, or polyimide resin, a composite resin material obtained by impregnating glass fibers or carbon fibers with such a resin material, or the like.

With the semiconductor package 300A illustrated in FIG. 15A, the semiconductor chip 320 is bonded and fixed to a front surface 310a of the package substrate 310 by the use of a die attach material 341, such as resin or a conductive paste, and is wire-bonded with a wire 350. The semiconductor chip 320 and the wire 350 are sealed by the sealing layer 330. Furthermore, with the semiconductor package 300B illustrated in FIG. 15B, the semiconductor chip 320 is flip-chip-connected to a front surface 310a of the package substrate 310 by a bump 321 made of a solder or the like. A space between the package substrate 310 and the semiconductor chip 320 is filled with an under-fill resin 342. The semiconductor chip 320 is sealed by the sealing layer 330. The sealing layer 330 is formed by the use of a resin material such as epoxy resin, a material obtained by making such a resin material contain an insulating filler, or the like.

A terminal 311a electrically connected to the conductor portion 311 is formed over a back surface 310b of the package substrate 310. The terminal 311a is an electrode (pad) or a post formed over an electrode. A bump 360 is formed over the terminal 311a. The bump 360 is formed by the use of a solder 361 containing a substance 362 whose crystal structure reversibly changes in temperature rise and fall processes which accompany the operation of an electronic device in which the semiconductor package 300A or the semiconductor package 300B is used or electronic equipment in which the electronic device is used.

A bump 321 in the semiconductor package 300B which bonds the semiconductor chip 320 and the package substrate 310 together may also be formed by the use of a solder containing a substance whose crystal structure reversibly changes in temperature rise and fall processes which accompany the operation of an electronic device or electronic equipment.

Furthermore, semiconductor chips 320 of the same kind or different kinds may be mounted over the package substrate 310 of the semiconductor package 300A or the semiconductor package 300B. In addition, not only the semiconductor chip 320 but also another electronic part, such as a chip capacitor, may be mounted over the package substrate 310 of the semiconductor package 300A or the semiconductor package 300B.

Figure 16:
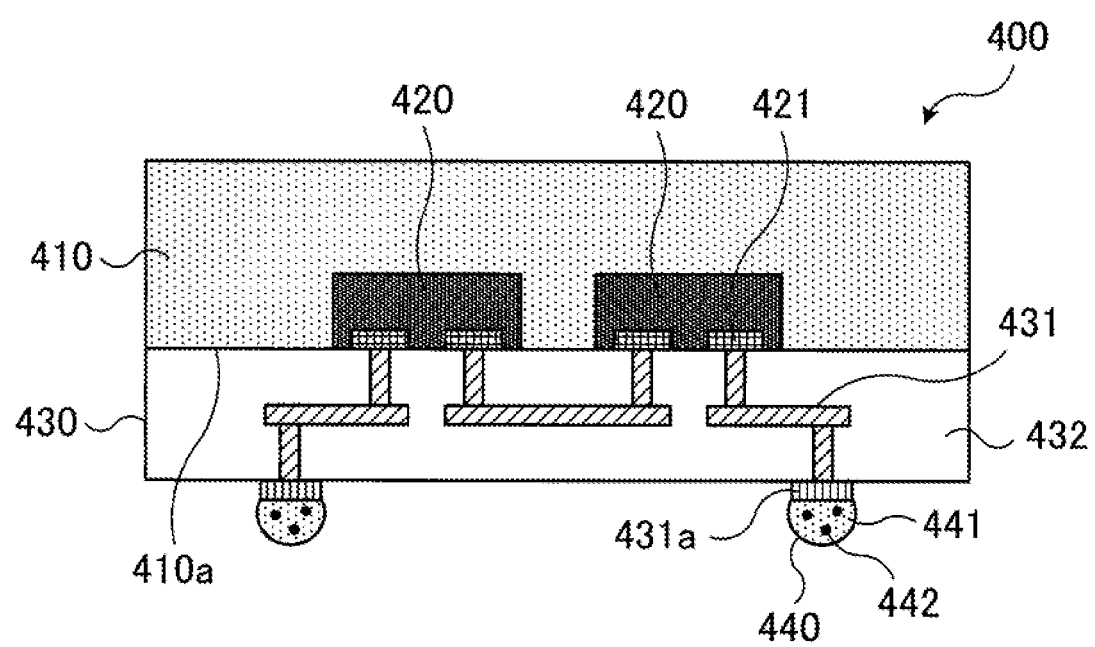
FIG. 16 illustrates another example of the structure of a semiconductor package.

FIG. 16 illustrates another example of the structure of a semiconductor package. FIG. 16 schematically illustrates a section of an important part of another example of a semiconductor package.

A semiconductor package 400 illustrated in FIG. 16 includes a resin layer 410, plural (two, in this example)

semiconductor chips 420 of the same kind or different kinds buried in the resin layer 410, and a wiring layer (rewiring layer) 430 formed over a front surface 410a of the resin layer 410. The semiconductor package 400 is also referred to as, for example, a pseudo-system-on-a-chip.

The semiconductor chips 420 are buried in the resin layer 410 so that their surfaces in which terminals 421 are arranged will be exposed. The wiring layer 430 includes a conductor portion (rewiring, a via, or the like) 431 formed by the use of Cu or the like and an insulating portion 432 which covers the conductor portion 431 and which is formed by the use of a resin material or the like.

A terminal 431a electrically connected to the conductor portion 431 is formed over the wiring layer 430. The terminal 431a is an electrode (pad) or a post formed over an electrode. A bump 440 is formed over the terminal 431a. The bump 440 is formed by the use of a solder 441 containing a substance 442 whose crystal structure reversibly changes in temperature rise and fall processes which accompany the operation of an electronic device in which the semiconductor package 400 is used or electronic equipment in which the electronic device is used.

One semiconductor chip 420 or three or more semiconductor chips 420 of the same kind or different kinds may be buried in the resin layer 410 of the semiconductor package 400. In addition, not only the semiconductor chips 420 but also another electronic part, such as a chip capacitor, may be buried in the resin layer 410 of the semiconductor package 400.

Figure 17:
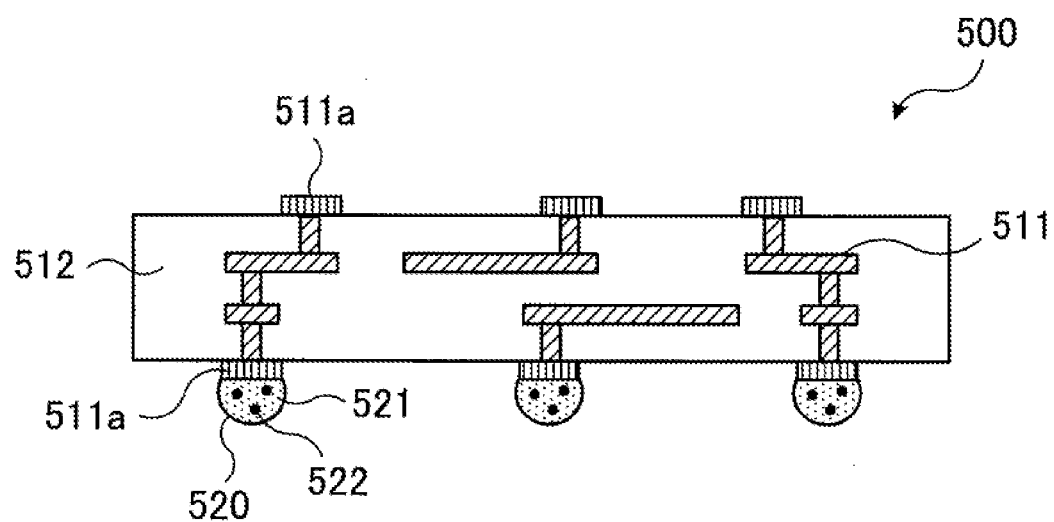
FIG. 17 illustrates an example of the structure of a circuit board.

FIG. 17 illustrates an example of the structure of a circuit board. FIG. 17 schematically illustrates a section of an important part of an example of a circuit board.

FIG. 17 illustrates a multilayer printed circuit board including plural wiring layers as a circuit board 500. The circuit board 500 includes a conductor portion (wiring, a via, or the like) 511 formed by the use of Cu or the like and an insulating portion 512 which covers the conductor portion 511 and which is formed by the use of a resin material or the like.

A terminal 511a electrically connected to the conductor portion 511 is formed over a surface of the circuit board 500. The terminal 511a is an electrode (pad) or a post formed over an electrode. A bump 520 is formed over the terminal 511a. The bump 520 is formed by the use of a solder 521 containing a substance 522 whose crystal structure reversibly changes in temperature rise and fall processes which accompany the operation of an electronic device in which the circuit board 500 is used or electronic equipment in which the electronic device is used.

In this example, the bump 520 is formed over the terminal 511a formed over one surface (lower surface) of the circuit board 500. However, the bump 520 may be formed over the terminal 511a formed over the other surface (upper surface) of the circuit board 500.

In the above case, a multilayer printed circuit board is taken as an example. However, the above bump 520 may be formed in the same way over a terminal formed over a surface of a build-up substrate formed by laminating wiring patterns and insulating layers over a front surface and a back surface of a core substrate or over a terminal formed over a surface of an interposer in which a Si substrate, an organic substrate, or a glass substrate is used as a core substrate.

Various electronic parts, such as the semiconductor chip 200 illustrated in FIG. 14, the semiconductor packages 300A, 300B, and 400 illustrated in FIGS. 15A, 15B, and 16 respectively, and the circuit board 500 illustrated in FIG. 17, are adopted as, for example, the electronic parts 10, 20, 80, 90, and 120 described in the first through fifth embodiments.

In addition, the above electronic device including a group of electronic parts bonded together by the use of a solder containing a substance whose crystal structure reversibly changes is used in various types of electronic equipment (electronic apparatus), such as computers (personal computers, supercomputers, servers, and the like), smartphones, portable telephones, tablet terminals, cameras, audio equipment, measuring equipment, inspection equipment, and manufacturing equipment.

Figure 18:
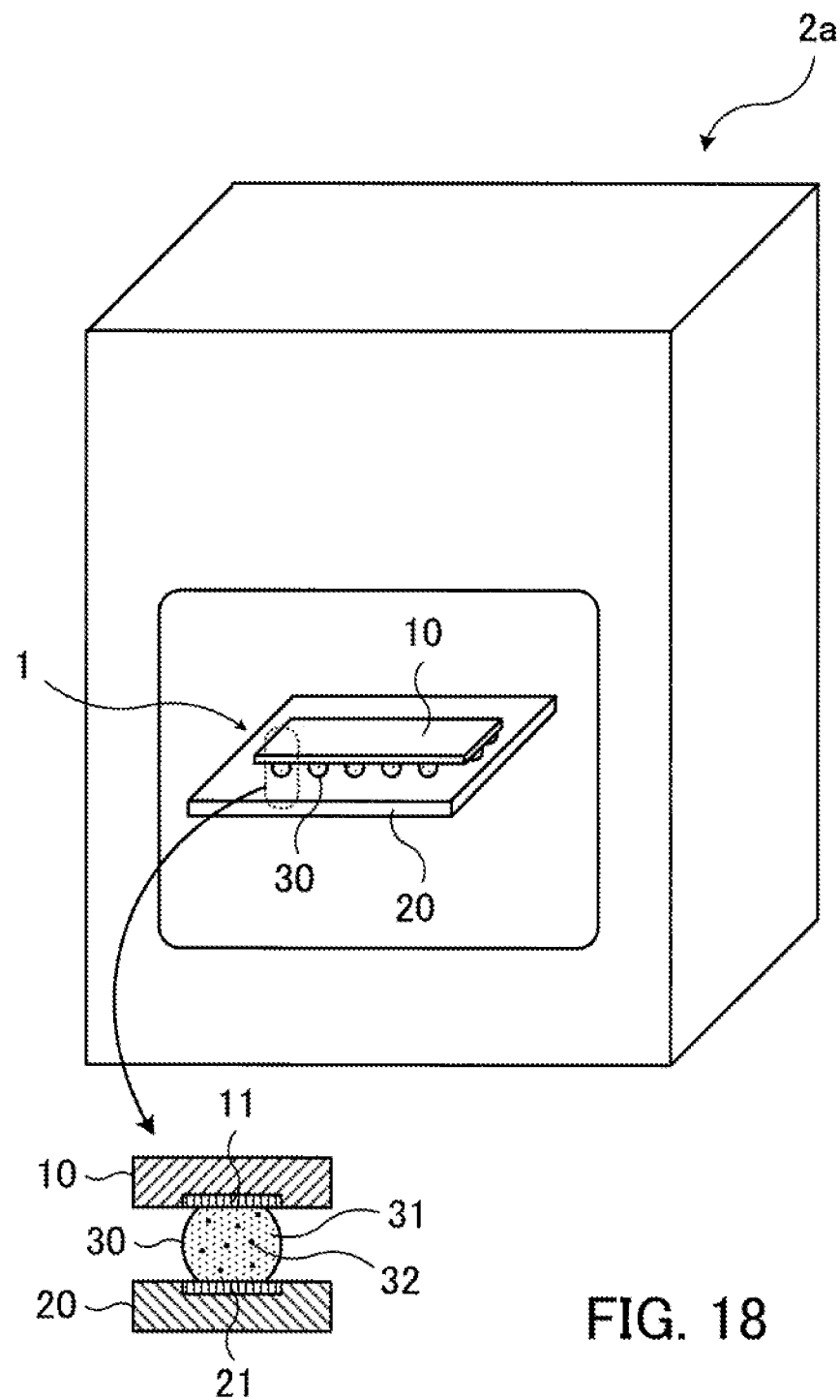
FIG. 18 illustrates an example of electronic equipment.

FIG. 18 illustrates an example of electronic equipment.

FIG. 18 schematically illustrates as an example a computer 2a including the electronic device 1 described above in the first embodiment. The electronic device 1 in which the solder 31 containing the above substance 32 is used is used in this way in the computer 2a. Furthermore, the electronic device 1 is used in various types of electronic equipment in addition to the computer 2a.

The various electronic devices described in the second through fifth embodiments are also used in various types of electronic equipment including the computer 2a.

By adopting the technique of using a solder containing the above substance, an electronic device or electronic equipment with high reliability is realized.

According to the disclosed technique, the coarsening of crystal grains in a solder is suppressed in temperature rise and fall processes which accompany operation, and an electronic device with high reliability is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic device comprising:
a first electronic part;
a second electronic part opposite the first electronic part; and
a bonding portion which bonds the first electronic part and the second electronic part together,
wherein the bonding portion includes a solder containing Sn and Bi and containing $Ag_2In$ whose crystal structure reversibly changes in temperature rise and fall processes which accompany operation.

2. The electronic device according to claim 1, wherein a temperature range in the temperature rise and fall processes is 0 to 100° C.

3. The electronic device according to claim 1, wherein the solder contains more than 39.5 weight % Sn, 3 weight % or less In and 3 weight % or less Ag, and balance Bi.

4. The electronic device according to claim 3, wherein an In content is equal to or higher than an Ag content.

5. The electronic device according to claim 1, wherein a melting point of the solder is 227° C. or less.

6. An electronic part comprising a terminal over which a solder containing Sn and Bi and containing $Ag_2In$ whose crystal structure reversibly changes in temperature rise and fall processes which accompany operation of an electronic device using the electronic part is used.

7. The electronic part according to claim 6, wherein a temperature range in the temperature rise and fall processes is 0 to 100° C.

8. A solder containing Sn and Bi and containing $Ag_2In$ whose crystal structure reversibly changes in temperature rise and fall processes which accompany operation of an electronic device using the solder.

9. The solder according to claim 8, wherein a temperature range in the temperature rise and fall processes is 0 to 100° C.

* * * * *